United States Patent [19]
Onai et al.

[11] Patent Number: 5,430,317
[45] Date of Patent: Jul. 4, 1995

[54] SEMICONDUCTOR DEVICE

[75] Inventors: Takahiro Onai, Ome; Katsuyoshi Washio, Tokorozawa, both of Japan; Tohru Nakamura, San Diego, Calif.

[73] Assignee: Hitachi, Ltd., Tokyo, Japan

[21] Appl. No.: 122,663

[22] Filed: Sep. 17, 1993

[30] Foreign Application Priority Data

Sep. 17, 1992 [JP] Japan ................. 4-247524

[51] Int. Cl.6 .................. H01L 27/01; H01L 27/12
[52] U.S. Cl. ........................... 257/347; 257/350; 257/506; 257/565; 257/588
[58] Field of Search ............. 257/347, 350, 370, 506, 257/565, 586, 588, 49

[56] References Cited

U.S. PATENT DOCUMENTS

| 5,040,037 | 8/1991 | Yamaguchi et al. | 257/408 |
| 5,212,397 | 5/1993 | See et al. | 257/347 |

FOREIGN PATENT DOCUMENTS 2-35739  6/1990  Japan .

OTHER PUBLICATIONS

"An Advanced High-Performance Trench-Isolated Self-Aligned Bipolar Technology," G. P. Li et al, IEEE Transactions on Electron Devices, vol. ED-34, No. 11, Nov. 1987.

Primary Examiner—Mark V. Prenty
Attorney, Agent, or Firm—Fay, Sharpe, Beall, Fagan, Minnich & McKee

[57] ABSTRACT

A transistor is formed on a bonded SOI substrate. A collector electrode is connected to the peripheral sides of the collector areas on the insulator. A first insulator of isolation is formed on the peripheral side of the collector electrode. A base electrode is connected to a base area on the first insulator of isolation. Second insulators of isolation are formed on the peripheral side of a base electrode, and emitter electrode is connected to an emitter area by the second insulators of isolation. The connections between the collector electrode and the collector areas, between the base electrode and the base area, and between the emitter electrode and the emitter area are made under the emitter electrode, so the occupation area is small.

24 Claims, 19 Drawing Sheets

SEMICONDUCTOR DEVICE

FIELD OF THE INVENTION

The present invention relates to a semiconductor device, and in particular to a semiconductor device for an integrated circuit having bipolar and MOS transistors suitable for large-scale integration.

BACKGROUND OF THE INVENTION

FIG. 2 shows a sectional view of a conventional general bipolar transistor. On a silicon substrate 20 are silicon oxide films 21, 22, 30 and 31, a highly-doped n-type collector area 23, a low-doped n-type collector area 24, a p-type base area 25, an n-type emitter area 26, a highly-doped p-type link base area 27, a polycrystal silicon base electrode 28, a polycrystal emitter area 29, and metallic electrodes 32 and 33.

This conventional transistor is shown, for example, in "IEEE, Trans. Electron Dev., ED-34, No. 11 (1987) pp. 2246-2245".

SUMMARY OF THE INVENTION

The conventional structure of a bipolar transistor as shown in FIG. 2 has a disadvantage that the occupation area of the transistor is large. This is because it is necessary to two-dimensionally arrange at least the contact holes of the emitter, base, and collector, which are determined by the minimum line width of lithography in forming the emitter, base, and collector electrodes.

Moreover, the conventional structure in FIG. 2 has a disadvantage of having a large parasitic capacitance.

Many factors affect parasitic capacitance. In the region where the collector and base electrodes are stacked, for example, according to the conventional bipolar transistor fabrication process, two photo masking steps are required to form the collector and base electrodes. As a result, a fluctuation in 0.2-0.3 μm can occur. Therefore, the overall length (the cross sectional dimension shown in FIG. 2) of the stacked area is made about 1.0 μm to compensate for this fluctuation, and the greater the area the greater its effect on capacitance. Another area whose size affects capacitance and that disadvantageously fluctuates due to photomask alignment fluctuations with conventional forming techniques is the area of the junction between the collector and base outside the periphery of the emitter. Still another area affecting capacitance is at the base electrode connection to the base, where the connection is sought to be made as small as possible without compromising good conductance, according to the present invention.

Therefore, it is an object of the present invention to provide a transistor for a semiconductor device having a small occupation area and a high performance. To achieve this object, a representative embodiment of a semiconductor device of the present invention has a convex single crystal semiconductor area formed on an insulator, wherein the convex single crystal semiconductor area includes collector single crystal semiconductor areas, a base single crystal semiconductor area and an emitter single crystal semiconductor area. The bottom surfaces of the collector single crystal semiconductor areas are formed in contact with the insulator. The top surfaces of the collector single crystal semiconductor areas are connected to the bottom surface of the base single crystal semiconductor area. The emitter single crystal semiconductor area is formed in the base single-crystal semiconductor area. A collector electrode, preferably of polycrystal silicon is formed on the insulator and connected to the peripheral sides of the collector single crystal semiconductor area. Alternatively, the collector area can be formed of a polycrystal silicon, and then the collector and collector electrode could be made in the same step. A first insulator of isolation is formed on the peripheral side of the collector electrode. A base electrode is formed on the first insulator of isolation and connected to the base single crystal semiconductor area. Second insulators of isolation are formed on the peripheral sides of the base electrode. Then, an emitter electrode is formed on the second insulators of isolation and connected to the emitter single crystal semiconductor area.

A preferred embodiment of the device of the present invention has a passivation insulator film that covers the convex single crystal semiconductor area, the collector electrode, the base electrode, and the emitter electrode. Also it is preferred that an emitter electrode layer be connected to the emitter electrode through an opening formed on the passivation insulator film.

According to the invention, the transistor occupation area is small and high performance is obtained because connections between the collector electrode and collector single crystal semiconductor area, between the base electrode and base single crystal semiconductor area, and between the emitter electrode and emitter single crystal semiconductor area are provided under, below or within the vertical bounds of the emitter electrode. The first insulator of isolation is formed between the collector electrode, which is a bottom layer, and the base electrode, which is a middle layer. The second insulators of isolation are formed between the base electrode, which is a middle layer, and the emitter electrode which is a top layer. Therefore, electrical isolation between the electrodes is obtained in spite of a stacked structure of electrodes comprising the bottom-layer collector electrode, middle-layer base electrode, and top-layer emitter electrode.

Also, according to the invention, the parasitic capacitance is minimized by controlling the size of the region where the collector and base electrodes are stacked by accurately forming these areas with a minimum number of fabrication steps that introduce fluctuation in the area dimensions, and also the junction area between the collector and base outside the emitter. In particular, according to the invention, the photo masking alignment problem of the conventional fabrication process is overcome so that the stacked collector and base electrode area can be reduced by not having to compensate for photo masking alignment fluctuations. Also, the contact area between the base and base electrode is minimized to retain the electrical connection function, but reduce the contributing affect this connection has to unwanted parasitic capacitance.

BRIEF DESCRIPTION OF THE DRAWINGS

FIG. 1(b) is a plan view, partially in section, of the device of FIG. 1(a), wherein FIG. 1(a) is taken along line 2—2 of FIG. 1(b);

FIG. 1o is sectional view taken in the direction of line 2—2 in FIG. 1(b) showing the next part of the fabrication process following that of FIG. 9;

FIG. 36 is sectional view taken in a direction corresponding to line 2—2 in FIG. 1(b) showing the next part of the fabrication process following that of FIG. 29;

DETAILED DESCRIPTION OF THE PREFERRED EMBODIMENTS

Figure 1A:
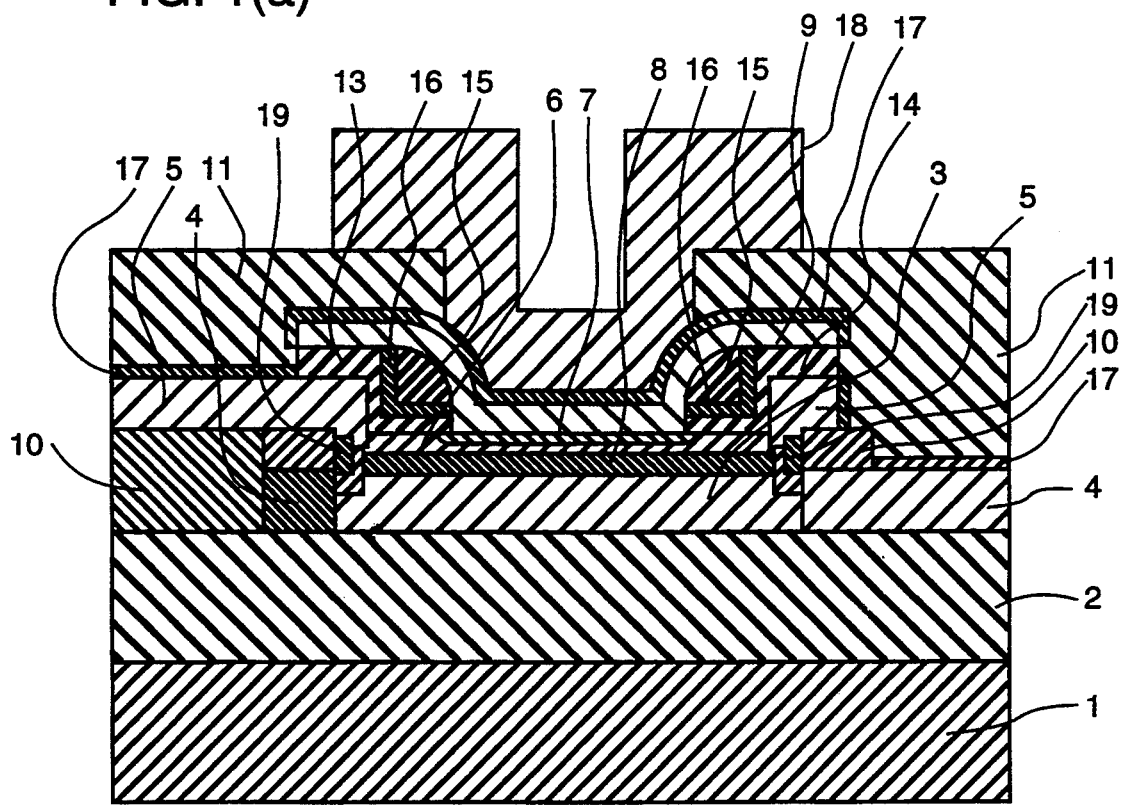
FIG. 1(a) is a sectional view of a semiconductor device of the present invention showing the element structure according to a first embodiment.
Figure 2:
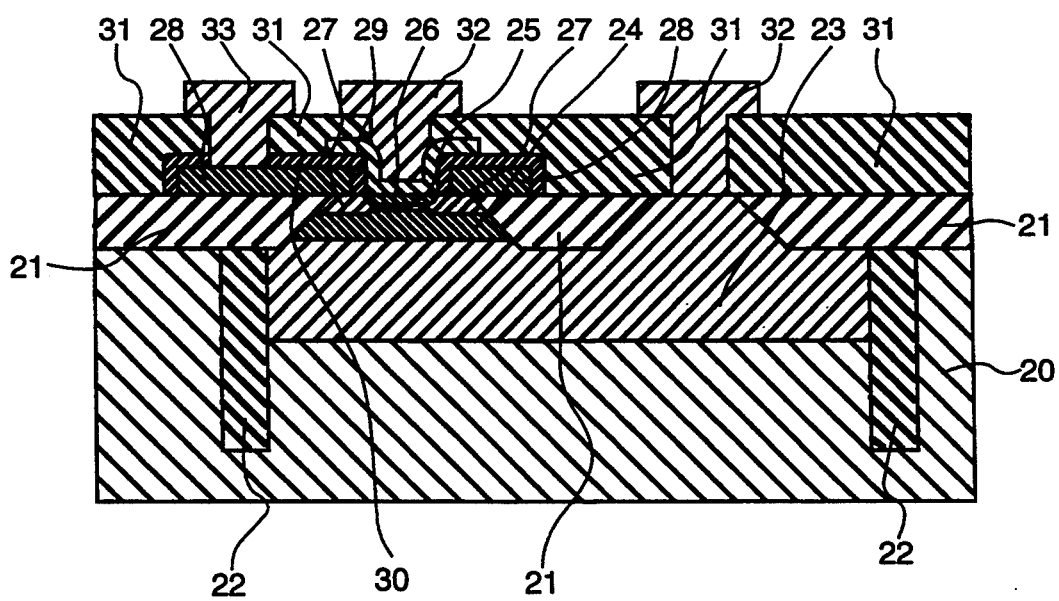
FIG. 2 is a sectional view of a conventional bipolar transistor showing the element structure of the device according to the prior art.
Figure 1B:
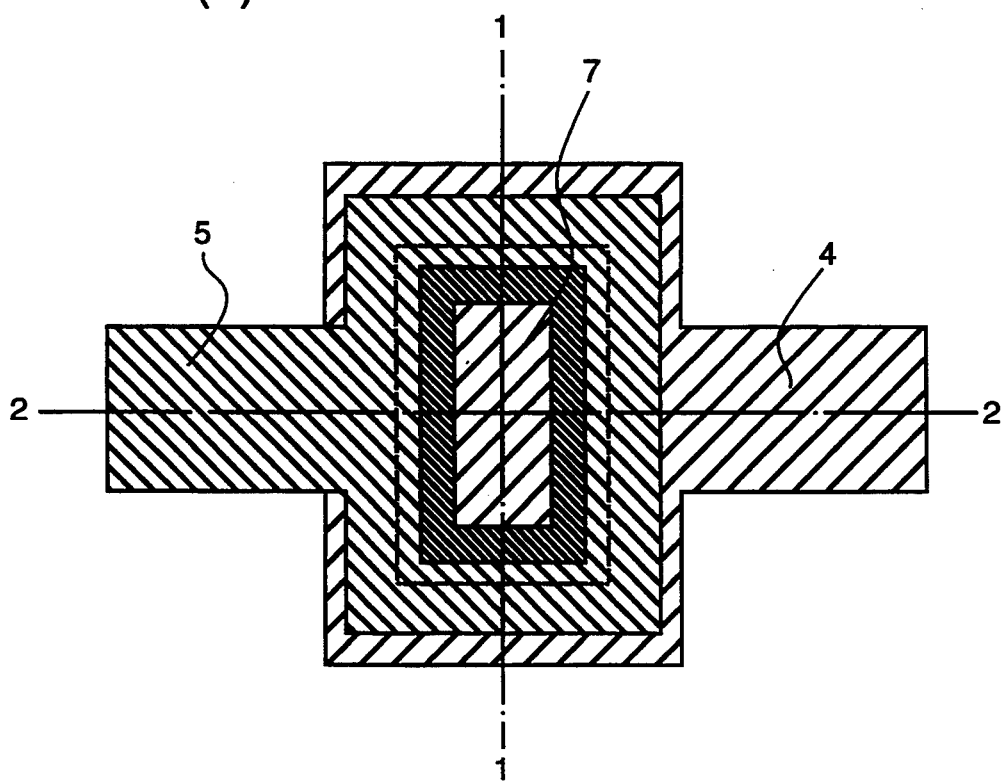

The semiconductor device of the first embodiment of the present invention includes a bipolar transistor that is shown in FIGS. 1(a) and 1(b). The fabricating steps are shown and discussed with reference to FIGS. 3–18.

As shown in FIGS. 1(a) and 1(b), the fabrication results in a highly doped n-type single crystal collector area 3, a low-doped n-type single crystal collector area 8, a p-type single crystal base area 6, a highly doped n-type emitter area 7, a highly-doped polycrystal n-type silicon collector electrode 4, a first insulator of isolation 10, a highly-doped polycrystal p-type silicon base electrode 5, second insulators of isolation 13 and 14, and a highly-doped polycrystal n-type silicon emitter electrode 9. The device also includes a metallic emitter electrode layer 18, a refractory metal (e.g., tungsten) or refractory metal silicide (e.g., tungsten silicide) 17 and silicon nitride films 16 and 19. The first insulator of isolation 10 and the second insulators of isolation 13 and 14 are formed of silicon oxide films, as are films 2, 11 and 15. A passivation insulator film 11 is formed over the convex single crystal semiconductor area, the collector electrode, the base electrode and the emitter electrode.

Figure 3:
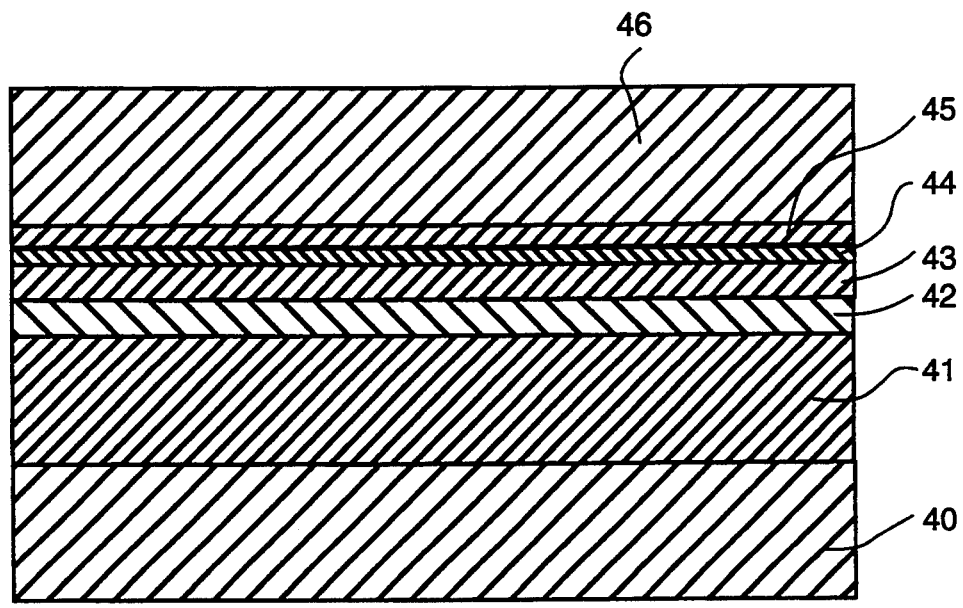
FIG. 3 is sectional view taken in the direction of line 2—2 in FIG. 1(b) showing a part of the fabrication process for fabricating the device of the present invention according to a first embodiment.

As shown in FIG. 3, first a bonded SOI (Silicon On Insulator) substrate is prepared. Preferably, silicon layer 42 formed on insulating film 41, which is formed on a silicon substrate 40, has a thickness of approximately 0.5 μm. Antimony is diffused into the silicon layer 42 on the insulating film to form a highly-doped n-type single crystal buried collector area. Alternatively, the collector area could be formed of a polycrystal silicon. The antimony diffusion is performed, for example, at 1,1750° C. for 60 min to achieve a concentration of approximately $5 \times 10^{19}/cm^3$. Then, a single crystal low-doped n-type collector area is formed through epitaxial growth of an oxide film 44 having a thickness of 20 to 50 nm, a silicon nitride film 45 having a thickness of approximately 100 nm, and an oxide film 46 having a thickness of 500 nm or more on the surface of the collector area.

Figure 4:
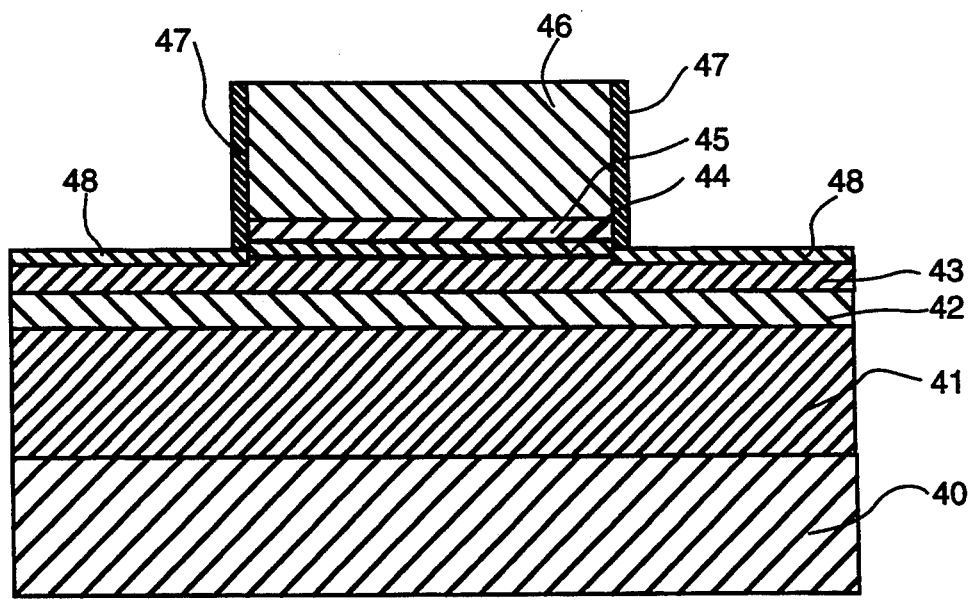
FIG. 4 is sectional view taken in the direction of line 2—2 in FIG. 1(b) showing the next part of the fabrication process following that of FIG. 3.

Then, as shown in FIG. 4, the oxide film 46, nitride film 45, and oxide film 44 are removed by anisotropic dry etching except in the transistor active area. Then, the exposed surface of silicon 43 is thermally oxidized to form an oxide film 48 with a thickness of approximately 20 nm and a nitride film 47 is deposited on the entire surface. The nitride film 47 is left only on the side walls of the oxide film 46, nitride film 45, and oxide film 44 by dry-etching of the nitride film 47.

Figure 5:
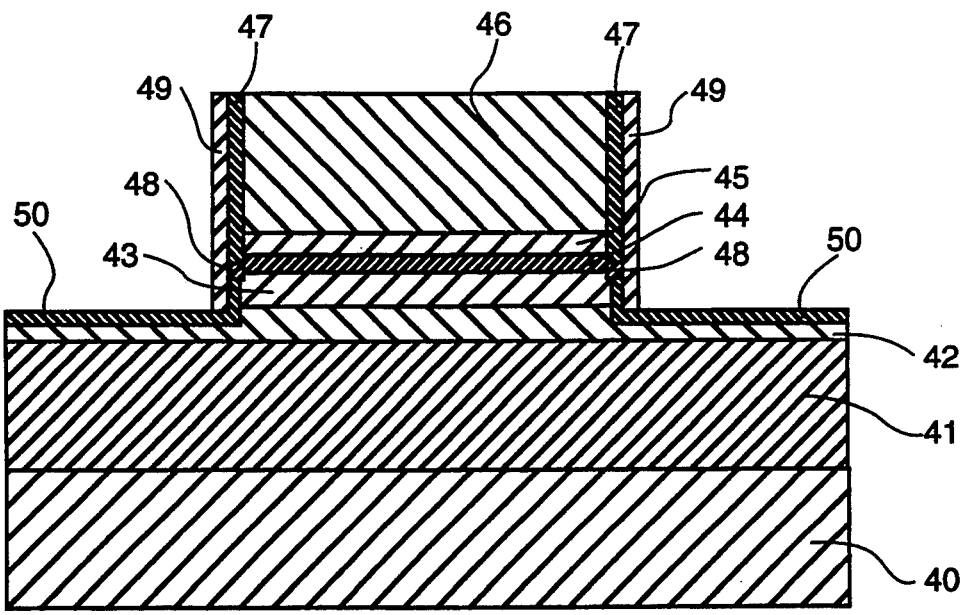
FIG. 5 is sectional view taken in the direction of line 2—2 in FIG. 1(b) showing the next part of the fabrication process following that of FIG. 4.

The oxide film 48 is removed and the exposed silicon film 43 is partially removed so that the film thickness is halved as shown in FIG. 5. An oxide film 50 with a thickness of 50 to 100 nm is formed on the silicon surface by thermal oxidation and a nitride film 49 is deposited. Then, the silicon nitride film 49 is etched to remove the horizontal portion of the film so that it is left only on the side walls of the nitride film 47 and oxide film 48 by anisotropic dry etching.

Figure 6:
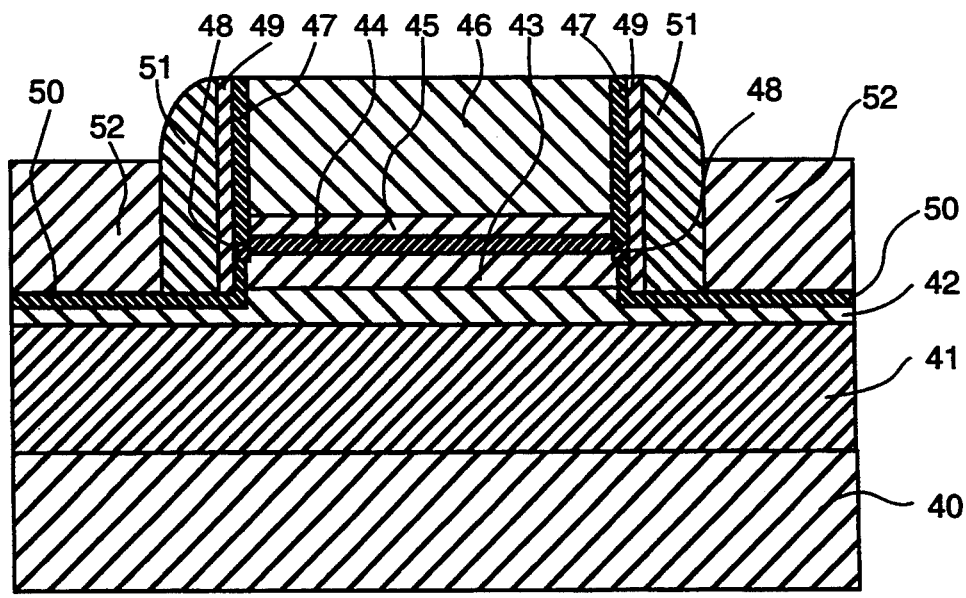
FIG. 6 is sectional view taken in the direction of line 2—2 in FIG. 1(b) showing the next part of the fabrication process following that of FIG. 5.

FIG. 6 illustrates a step of depositing a polycrystal silicon film 51 from 200 to 300 nm in thickness to form polycrystal silicon 51 on the side walls of the nitride film 49 by anisotropic dry etching. The thickness of film 51 ultimately controls the size of the stacked area of the collector and base electrodes. Since it is an object of the invention to minimize the size of this region, the thickness of film 51 is carefully controlled to within a 1% variation. Then, a resist 52 is applied to the silicon surface in a thickness of up to 2 μm or more to smooth the surface. The top surface of polycrystal silicon 51 is revealed by etching-back.

Figure 7:
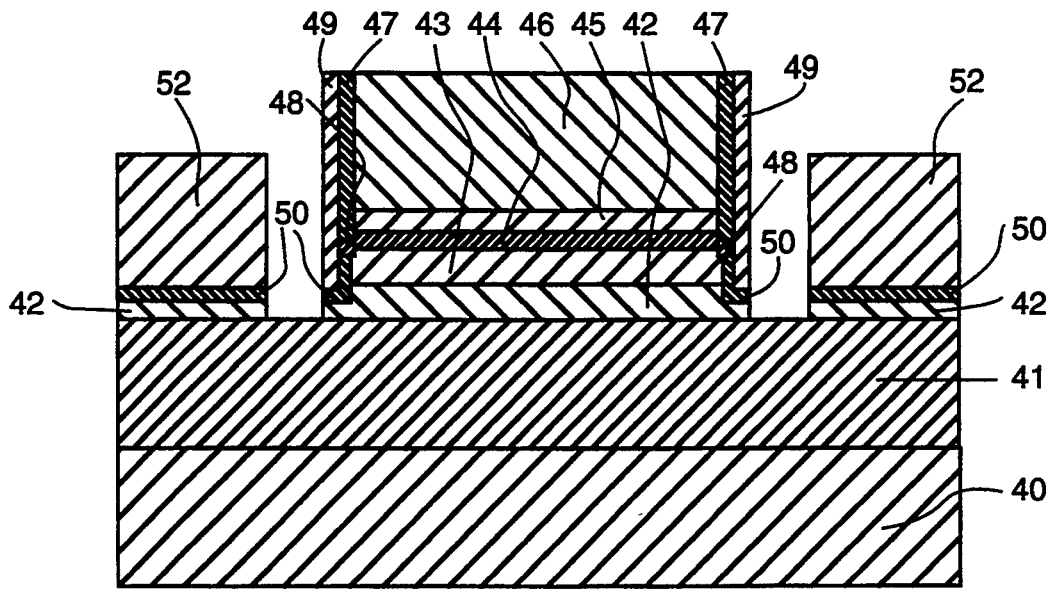
FIG. 7 is sectional view taken in the direction of line 2—2 in FIG. 1(b) showing the next part of the fabrication process following that of FIG. 6.

As shown in FIG. 7, polycrystal silicon 51 is removed by using the resist 52, oxide film 46, and nitride films 47 and 49 as masks. The oxide film 50 is also removed in the area in which the polycrystal silicon 51 is removed. And further the silicon 42 is removed by using the resist 52, the oxide film 46, and nitride films 47 and 48 as masks.

Figure 8:
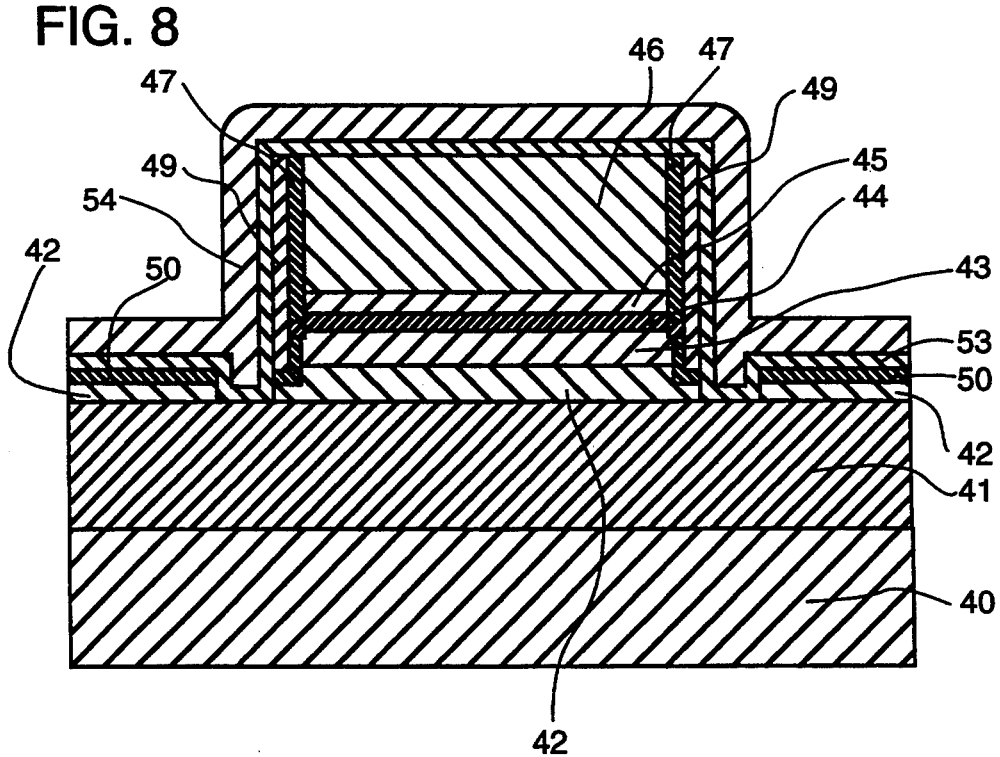
FIG. 8 is sectional view taken in the direction of line 2—2 in FIG. 1(b) showing the next part of the fabrication process following that of FIG. 7.

The resist 52 is removed and a nitride film 53 is deposited in a thickness of up to approximately 20 nm as shown in FIG. 8. Also a polycrystal silicon film 54 is deposited so that the groove area that is shown is filled with silicon.

Figure 9:
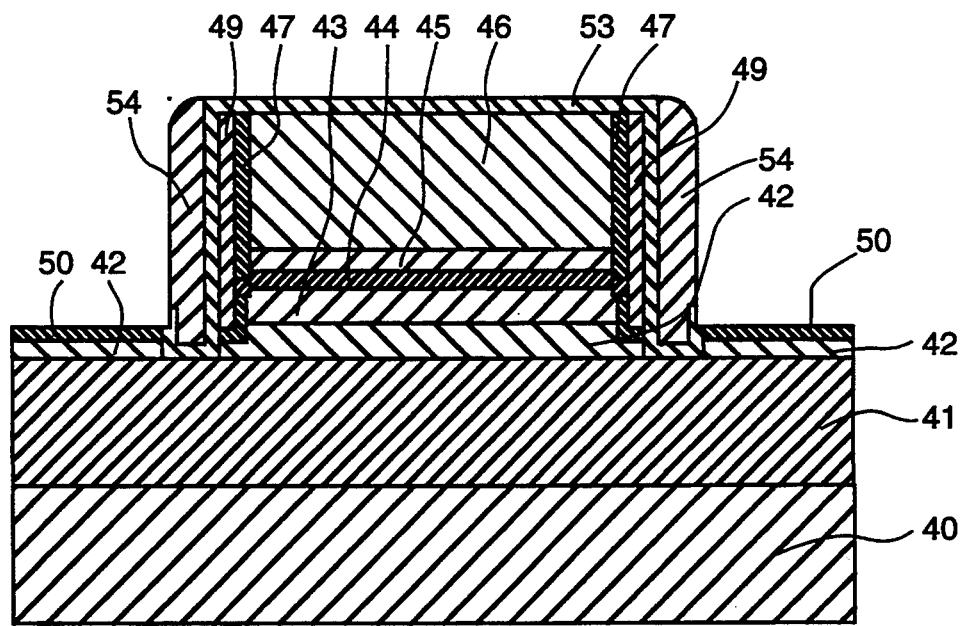
FIG. 9 is sectional view taken in the direction of line 2—2 in FIG. 1(b) showing the next part of the fabrication process following that of FIG. 8.
Figure 10:
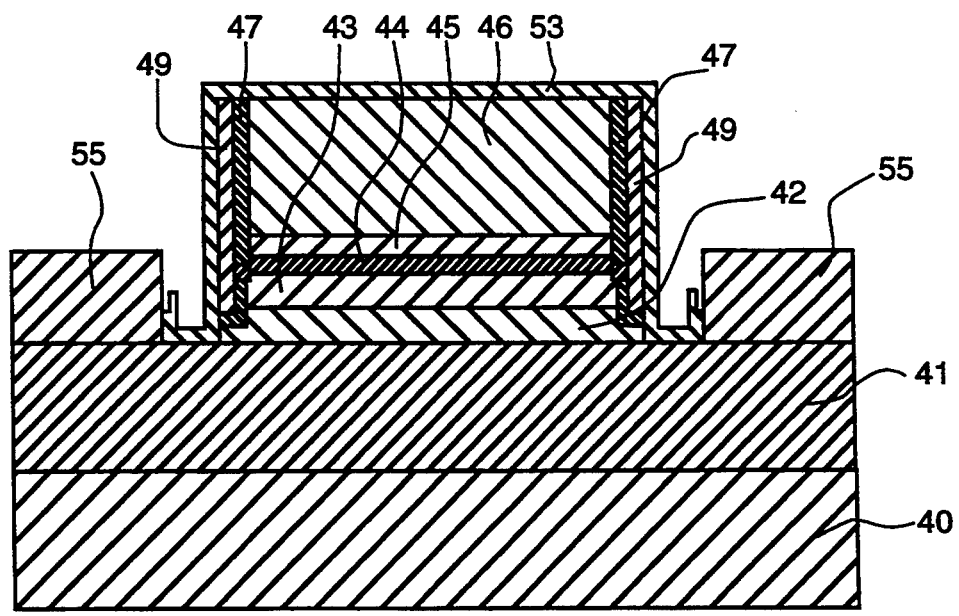

As shown in FIG. 9, the polycrystal silicon 54 is removed by anisotropic dry etching. The nitride film 53 around the transistor area which is exposed as a result is also removed. In FIG. 10, it is shown that the polycrystal silicon 54 is removed and the peripheral silicon 42 is selectively oxidized by using the nitride film 53 as a mask to form an oxide film 55.

Figure 11:
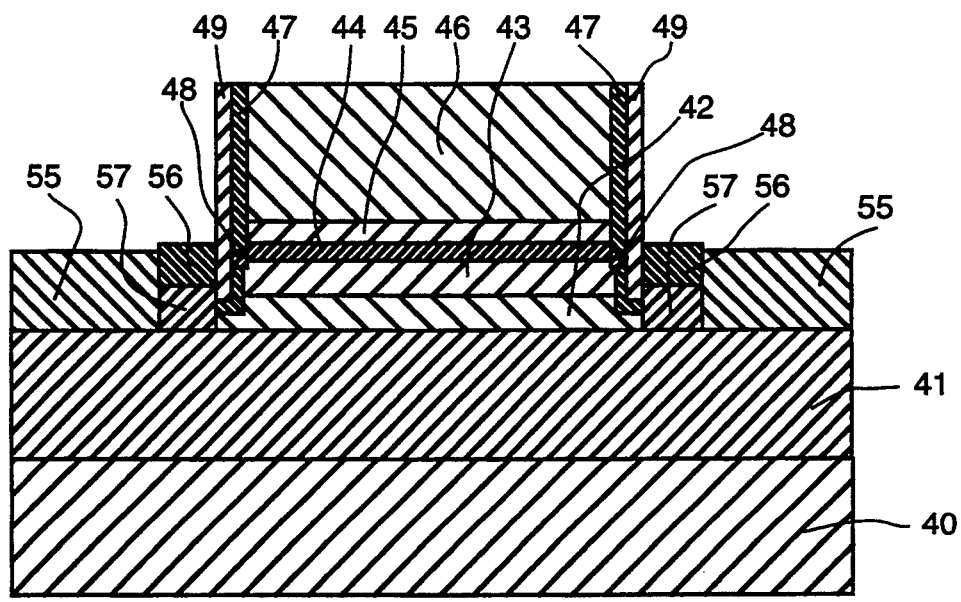
FIG. 11 is sectional view taken in the direction of line 2—2 in FIG. 1(b) showing the next part of the fabrication process following that of FIG. 10.
Figure 16:
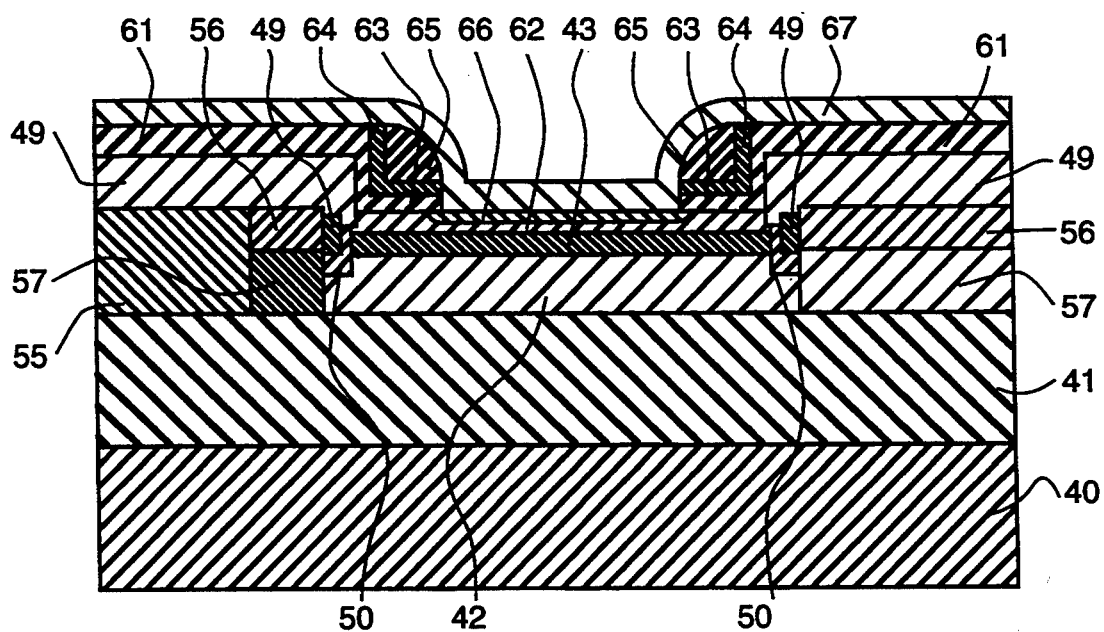
FIG. 16 is sectional view taken in the direction of line 2—2 in FIG. 1(b) showing the next part of the fabrication process following that of FIG. 15.

The nitride film 53 is removed to deposit a polycrystal silicon 57 in such a way that the groove area is filled as shown in FIG. 11. The polycrystal silicon film 57 forms the collector electrode and is left in the groove that surrounds the periphery of layer 42 by removing the remainder thereof by isotropic dry etching. As shown in FIG. 16, a portion of the layer 57 extends toward a side of the device to form a side contact point that can be used for connecting the collector electrode to another device or the like. Subsequently, phosphorus ions are implanted into the polycrystal silicon 57 to electrically connect the highly-doped n-type polycrystal silicon 57 to the highly-doped n-type buried collector area 42. Then, an oxide film 56 with a thickness of approximately 300 nm is formed on the surface of the polycrystal silicon 57 by a high-pressure oxidation method.

As a result of the foregoing fabrication steps, there is a junction area formed between the collector and the collector electrode. If, on the other hand, the layer forming the collector is deposited as a polycrystal silicon layer in the steps described with reference to FIG. 3, as an alternative embodiment, then the junction area between the collector electrode and the collector would exist only in terms of the fabrication technique, and not in terms of a difference in materials in this area. Further, in this case, it may be possible to form the collector and collector electrode films in the same deposition step. For the purposes of distinguishing between the collector and collector electrode, however, these components of the semiconductor device are considered to be separate from one another with a junction point or area therebetween.

Figure 12:
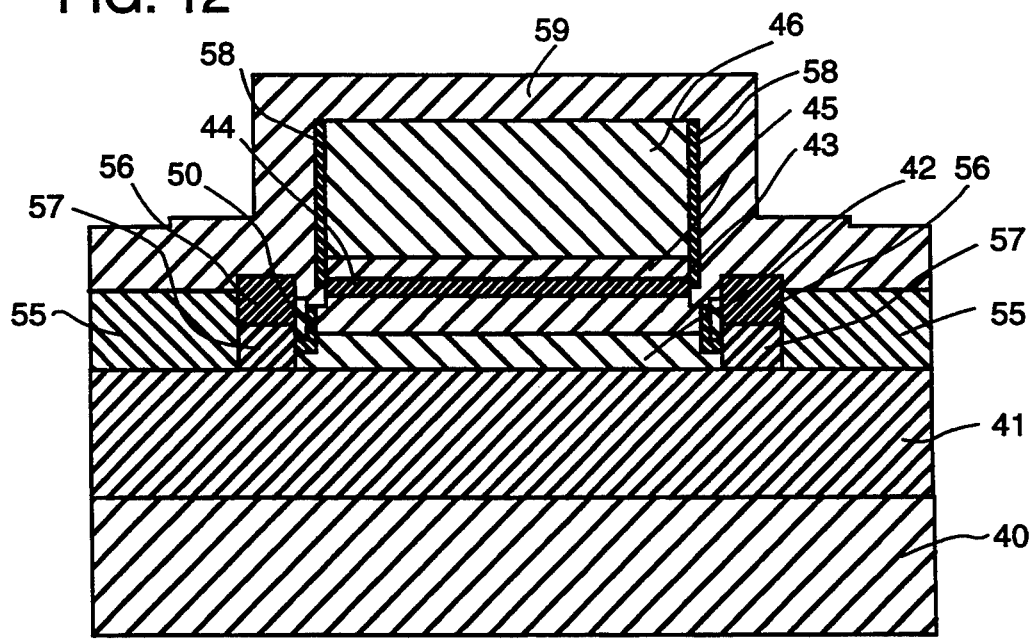
FIG. 12 is sectional view taken in the direction of line 2—2 in FIG. 1(b) showing the next part of the fabrication process following that of FIG. 10.

FIG. 12 shows that the remaining portion of film 48 and a portion of the nitride films 47 and 49 are removed in the next step to open a contact hole or opening that extends through to the base. A buried portion of the nitride film 49 in the groove is not removed. Then, a nitride film 58 with a thickness of approximately 20 nm is deposited and thereafter etched so that a portion of it is left on the side walls of the oxide film 46 and nitride film 45. Where the remaining portion of oxide film 48 is removed, a connection is made between the base and the base electrode in the completed device. Specifically, in an initial step in forming the base electrode, a polycrystal silicon film 59 is deposited up to 300 to 400 nm in thickness in contact with silicon layer 43.

Figure 13:
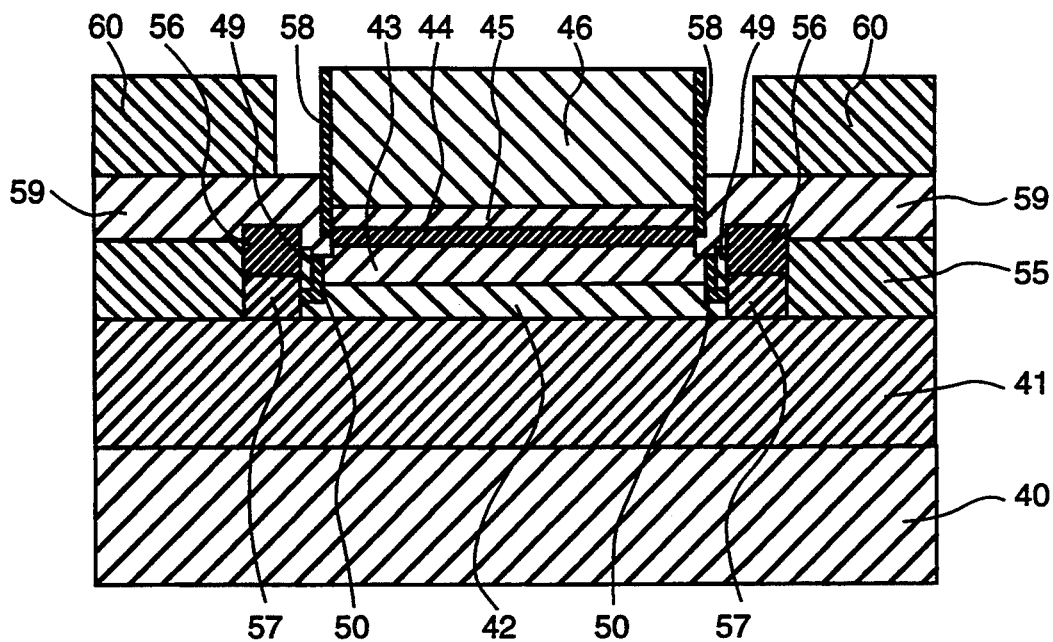
FIG. 13 is sectional view taken in the direction of line 2—2 in FIG. 1(b) showing the next part of the fabrication process following that of FIG. 12.
Figure 14:
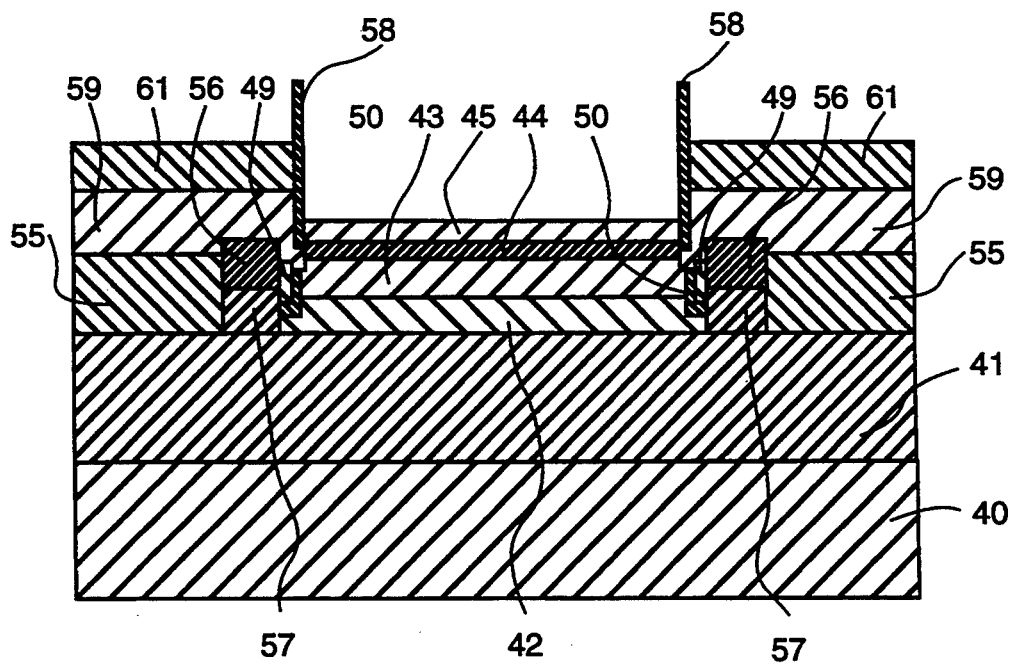
FIG. 14 is sectional view taken in the direction of line 1—1 in FIG. 1(b) showing the next part of the fabrication process following that of FIG. 13.

In the fabrication steps shown with reference to FIG. 13, first boron ions are implanted to make the polycrystal silicon 59 highly-doped p-type for good conductance, and a resist 60 is left on the polycrystal silicon 59. The revealed polycrystal silicon 59 is etched back by isotropic dry etching. Then, as shown in FIG. 14, the resist 60 and oxide film 46 are removed and an oxide film 61 with a thickness of 300 to 400 nm is formed on the surface of the polycrystal silicon 59 by thermal oxidation.

Figure 15:
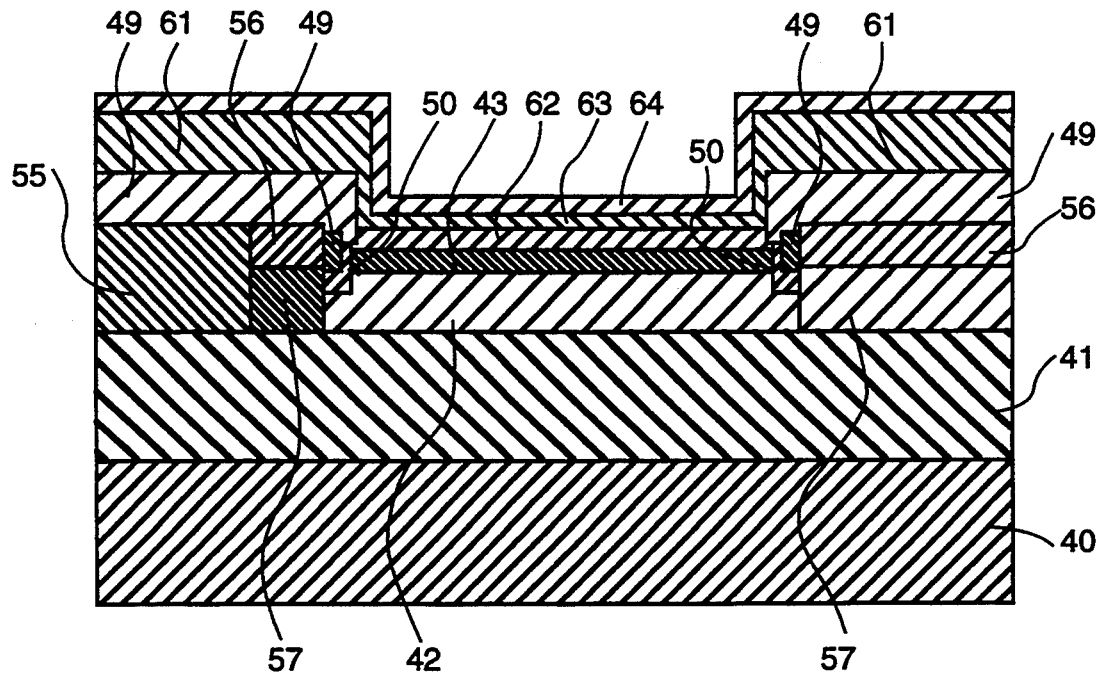
FIG. 15 is sectional view taken in the direction of line 2—2 in FIG. 1(b) showing the next part of the fabrication process following that of FIG. 14.

FIG. 15 shows that nitride films 45 and 58 and oxide film 44 are removed next. An oxide film 63 with a thickness of 20 to 30 nm is formed on the surface of the revealed silicon 43. Then, boron or boron-fluoride ($BF_2$) ions are implanted to form a p-type base 62, and a nitride film 64 with a thickness of approximately 30 nm is deposited on oxide film 63.

Moreover, as shown in FIG. 16, an oxide film 65 is deposited in a thickness of up to 100 to 300 nm and the oxide film 65 is left on the side walls or vertical surfaces by anisotropically dry-etching the oxide film 65. The nitride film 64 is removed by using the oxide films 61 and 65 as masks and then the oxide film 63 is removed to make a contact hole for an emitter. A polycrystal silicon 67 of up to 100 to 200 nm in thickness is then deposited. Arsenic is implanted into the polycrystal silicon 67 to make it highly-doped n-type. When the polycrystal silicon 67 is doped with phosphorus or arsenic in the deposition of the silicon 67, it is unnecessary to implant arsenic. Then, the arsenic or phosphorus in the polycrystal silicon 67 is diffused into the single-crystal silicon to form a highly-doped n-type emitter area 66. In the ion implantation step that forms emitter area 66, oxide film 65 is used as a mask thus enabling careful control of the junction area between the base and collector outside the emitter. Controlling the size of this area is important in reducing parasitic capacitance in the device.

Figure 17:
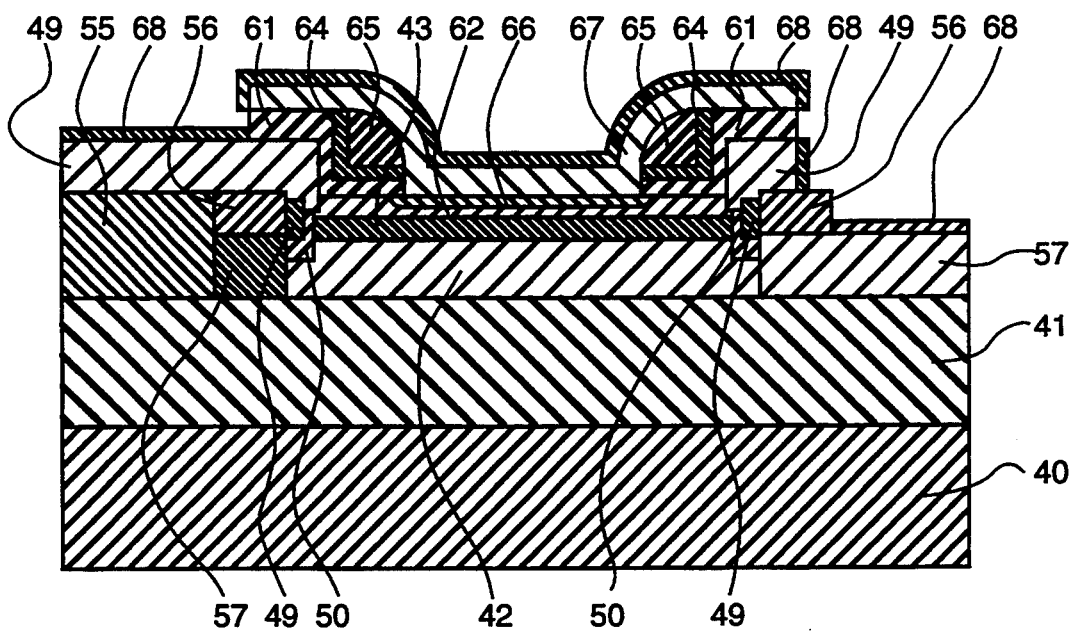
FIG. 17 is sectional view taken in the direction of line 2—2 in FIG. 1(b) showing the next part of the fabrication process following that of FIG. 16.

Subsequently, the polycrystal silicon 67 is patterned with a resist mask and the oxide film 61 is removed as shown in FIG. 17, by using the resist mask. Then, polycrystal silicon 49 is patterned by using another resist mask and the oxide film 56 on the surface of the polycrystal silicon 57 is removed by using the same resist mask. Thus, the peripheral edge of the base electrode is formed with the mask used to form the like edge of the emitter electrode. The resist is removed and tungsten 68 is deposited by selective CVD on the exposed surfaces of the remaining portions of polycrystal silicon layers 67, 49, and 57.

Figure 18:
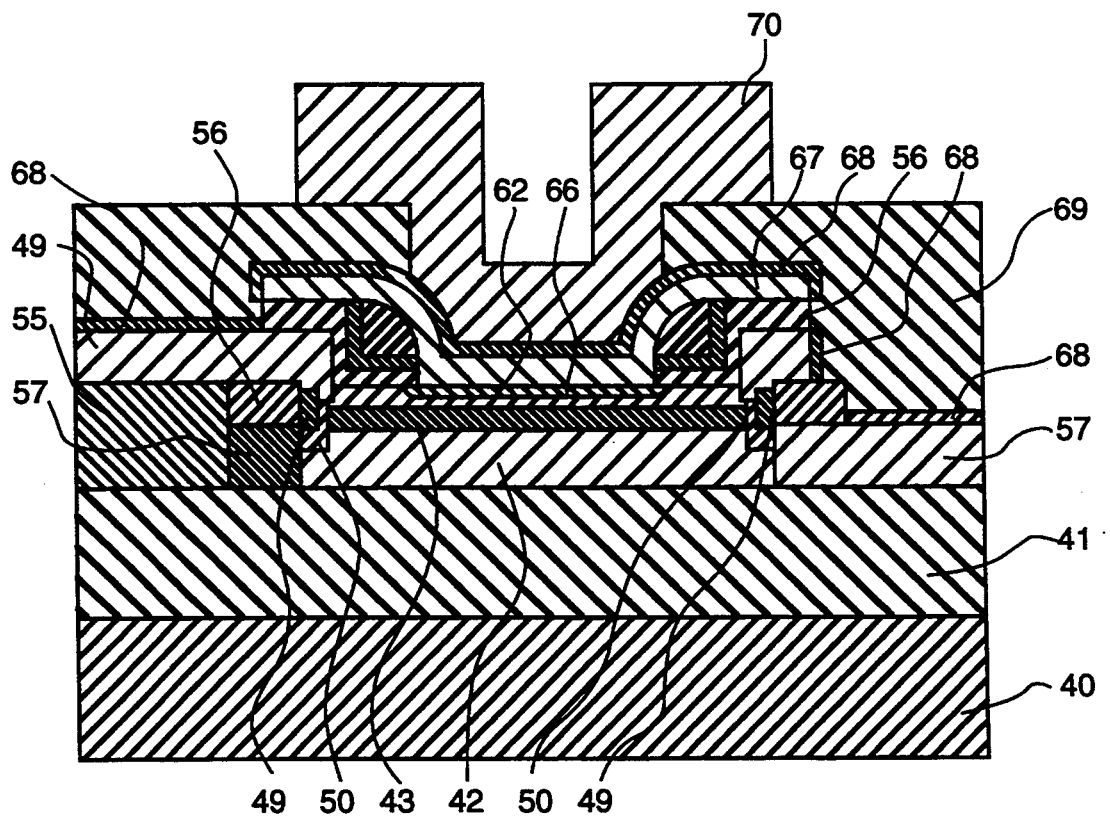
FIG. 18 is sectional view taken in the direction of line 2—2 in FIG. 1(b) showing the next part of the fabrication process following that of FIG. 17.

Preferably, as shown in FIG. 18, an oxide film 69 for surface protection is formed over the entire surface of the transistor at a temperature below 500° C., and a hole is made in the oxide film 69 on the emitter. An emitter metal electrode layer 70 is then formed to extend into the hold. Thus the transistor of a semiconductor device fabricated according to the first embodiment of the invention and as shown in FIG. 1 is completed.

According to this embodiment it is possible to decrease the transistor area to approximately 1/10 of that for a conventional transistor by using the same design rule. In particular it is possible to realize a transistor area of 1 μm² when lithography having a minimum line width of 0.2 μm is used.

Figure 24:
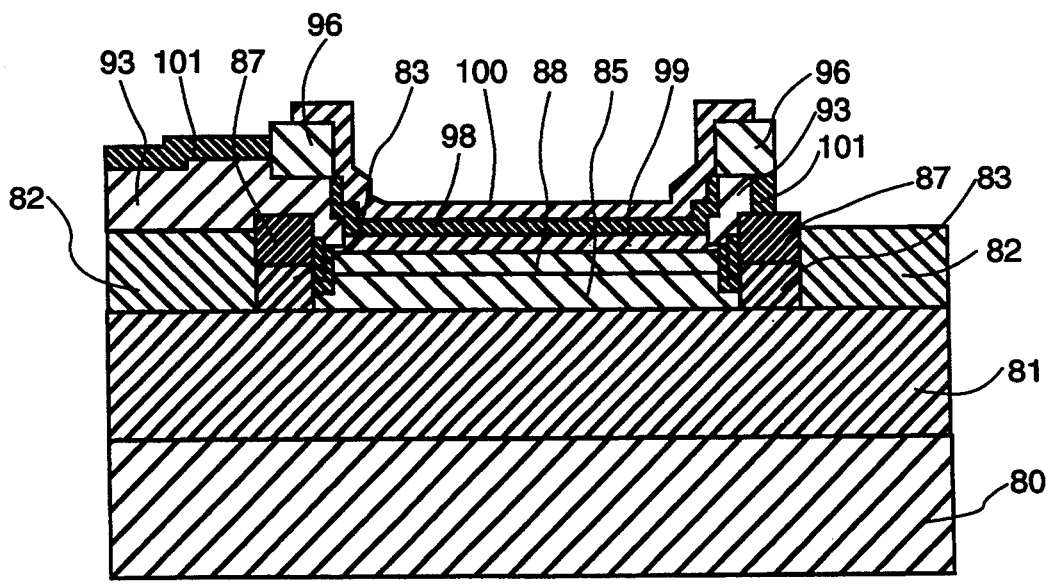
FIG. 24 is sectional view taken in a direction corresponding to line 1—1 in FIG. 1(b) showing the next part of the fabrication process following that of FIG. 23.
Figure 25:
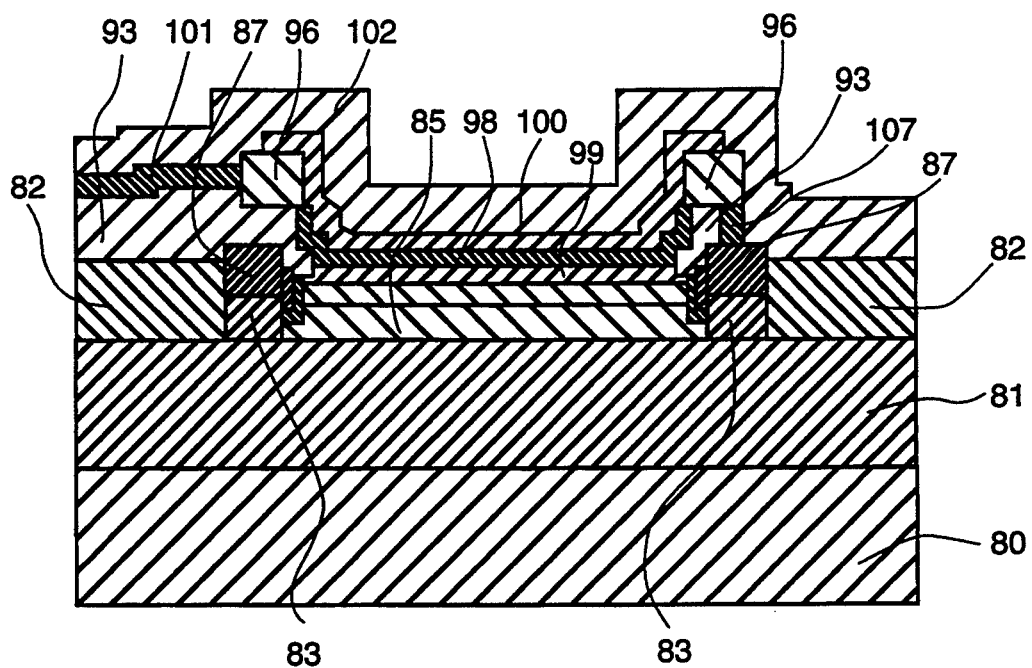
FIG. 25 is sectional view taken in a direction corresponding to line 1—1 in FIG. 1(b) showing the next part of the fabrication process following that of FIG. 24.
Figure 26:
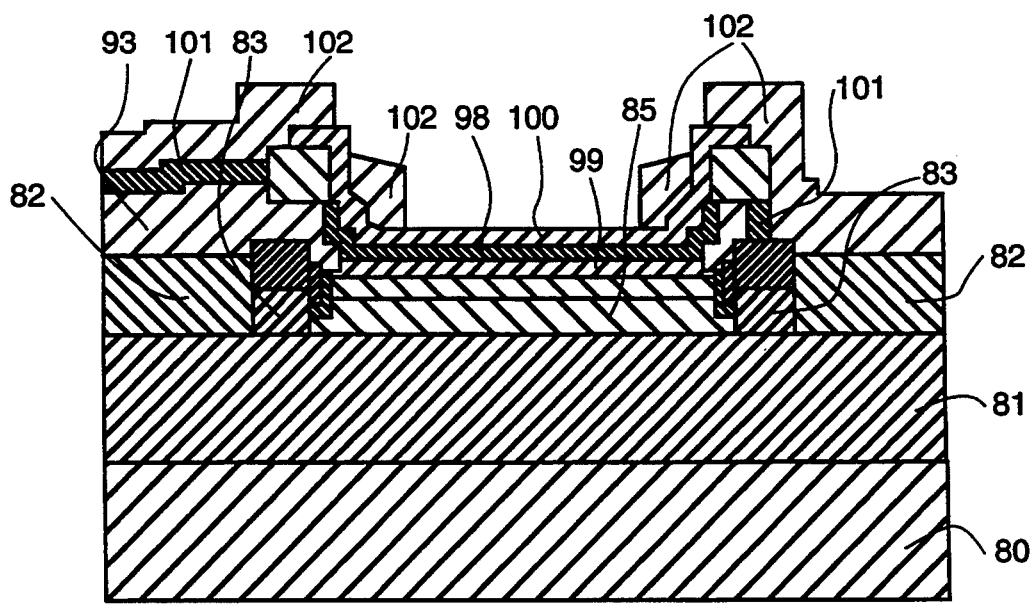
FIG. 26 is sectional view taken in a direction corresponding to line 2—2 in FIG. 1(b) showing the next part of the fabrication process following that of FIG. 25.

FIGS. 19 to 26 show a second embodiment of a semiconductor device having a transistor constructed according to the present invention. This embodiment uses tungsten silicide for a base electrode. The following description with reference to FIGS. 192–26 show the process flow for fabricating the device of this embodiment. Because the process of fabricating the device according to this embodiment has steps in common with those illustrated by the figures up to FIG. 12 for fabricating the device of the first embodiment, their description is omitted.

Figure 19:
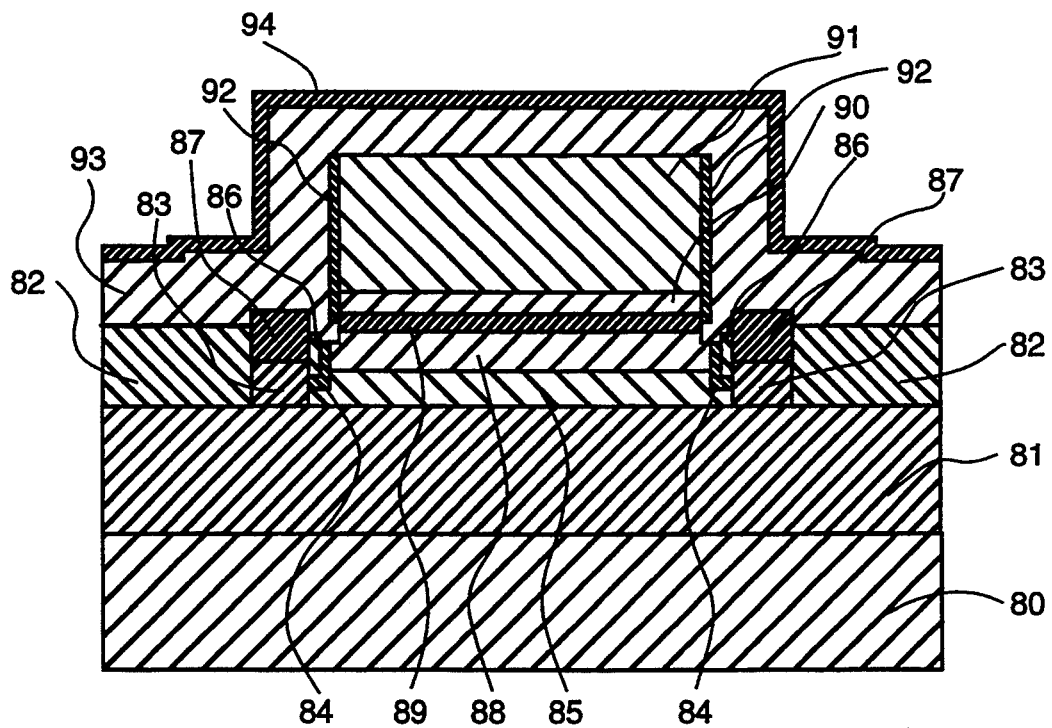
FIG. 19 is sectional view taken in a direction corresponding to line 1—1 in FIG. 1(b) showing a part of the fabrication process that follows the process steps illustrated up to FIG. 12 for fabricating a semiconductor device of the present invention according to a second embodiment thereof.

In this embodiment, polycrystal silicon 93 is deposited and then a nitride film 94 is deposited as shown in FIG. 19. In FIG. 19, 80 identifies a silicon substrate, and 81, 82, 84, 87, 89, and 91 identify silicon oxide films. The device includes a polycrystal silicon collector electrode 83, a highly-doped collector 85, silicon nitride films 86, 90, 92 and 94, a low-doped collector 88, and a polycrystal silicon base electrode 93.

Figure 20:
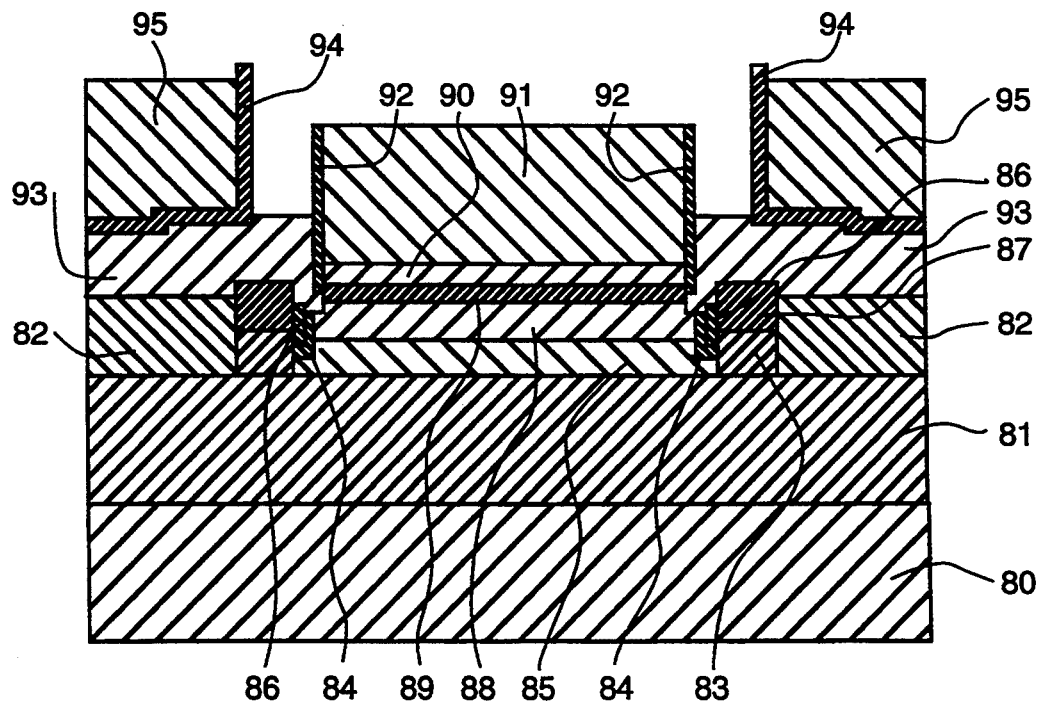
FIG. 20 is sectional view taken in a direction corresponding to section line 1—1 in FIG. 1(b) showing the next part of the fabrication process following that of FIG. 19.
Figure 21:
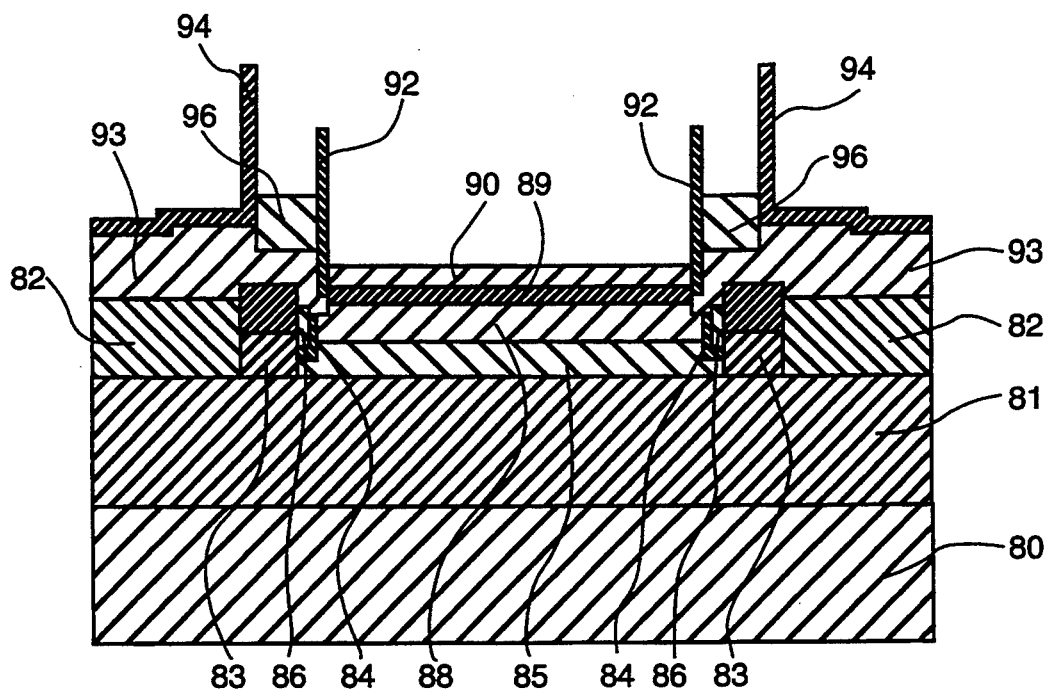
FIG. 21 is sectional view taken in a direction corresponding to line 1—1 in FIG. 1(b) showing the next part of the fabrication process following that of FIG. 20.

As shown in FIG. 20, similarly to the first embodiment, a resist 95 is formed, a revealed nitride film 94 is removed, and the polycrystal silicon 93 is etched back. Then, the resist 95 and oxide film 91 are removed and the exposed polycrystal silicon 93 (not covered with the nitride films 90 and 94) is oxidized under a high pressure to form an oxide film 96 with a thickness of 300 to 400 nm as shown in FIG. 21.

Figure 22:
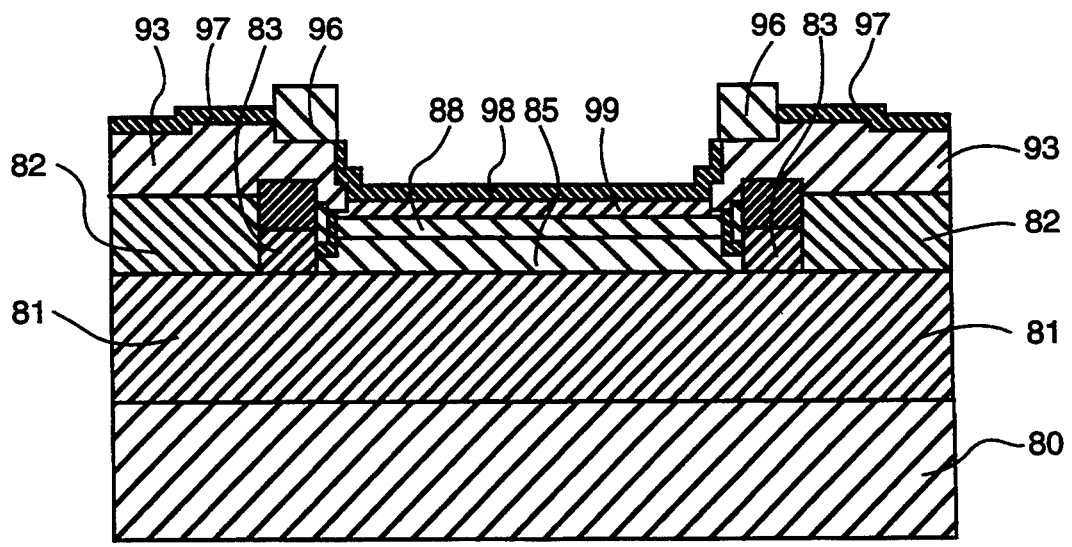
FIG. 22 is sectional view taken in a direction corresponding to line 1—1 in FIG. 1(b) showing the next part of the fabrication process following that of FIG. 21.

FIG. 22 shows the next steps of the fabrication process, wherein the nitride films 90, 92, and 94, and the oxide film 89 are successively removed and oxide films 97 and 98 with a thickness of approximately 20 nm are formed on the exposed surfaces of silicon layers 93 and 88. Then, boron or boron fluoride is implanted to form a single-crystal p-type base area 99.

Figure 23:
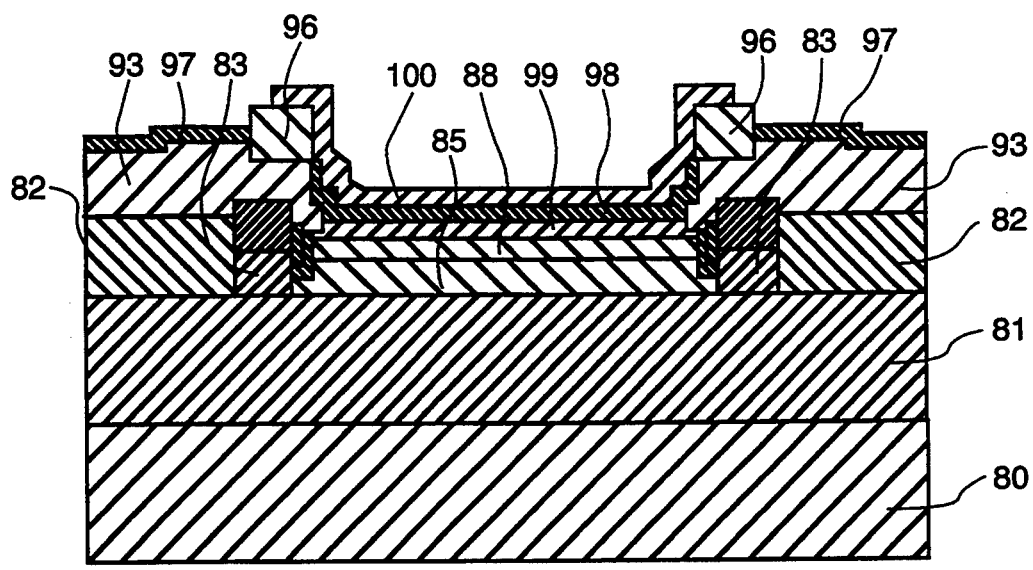
FIG. 23 is sectional view taken in a direction corresponding to line 1—1 in FIG. 1(b) showing the next part of the fabrication process following that of FIG. 22.

Next, a nitride film 100 is deposited and the nitride film 100 is so patterned that it is left on a transistor active area by using a resist mask as shown in FIG. 23. Then, as shown in FIG. 24, a resist is formed on the active area and a base electrode lead-out area is formed by selectively etching the polycrystal silicon 93. After the resist and oxide film 97 are removed, tungsten is deposited to form tungsten silicide 101 only on the polycrystal silicon 93 by applying high temperature thermal treatment at 700° to 900° C.

Moreover, as shown in FIG. 25, an oxide film 102 is deposited on the entire surface. Then, as shown in FIG. 26, the oxide film is anisotropically dry-etched with a resist mask to leave the oxide film 102 on the side wall of the step. Subsequently, an emitter is formed by the method shown in FIGS. 15 and 16 of the first embodiment. In a semiconductor device having transistors according to this second embodiment, a plurality of uniform transistors with no variation in shape are formed, and further the area of each transistor as compared with the first embodiment is decreased since the base electrode is formed by self alignment.

FIGS. 27 to 30 show a semiconductor device according to a third embodiment having an npn transistor and a pnp transistor formed on the same substrate. The fabrication method will be described below with reference to the figures.

Figure 27:
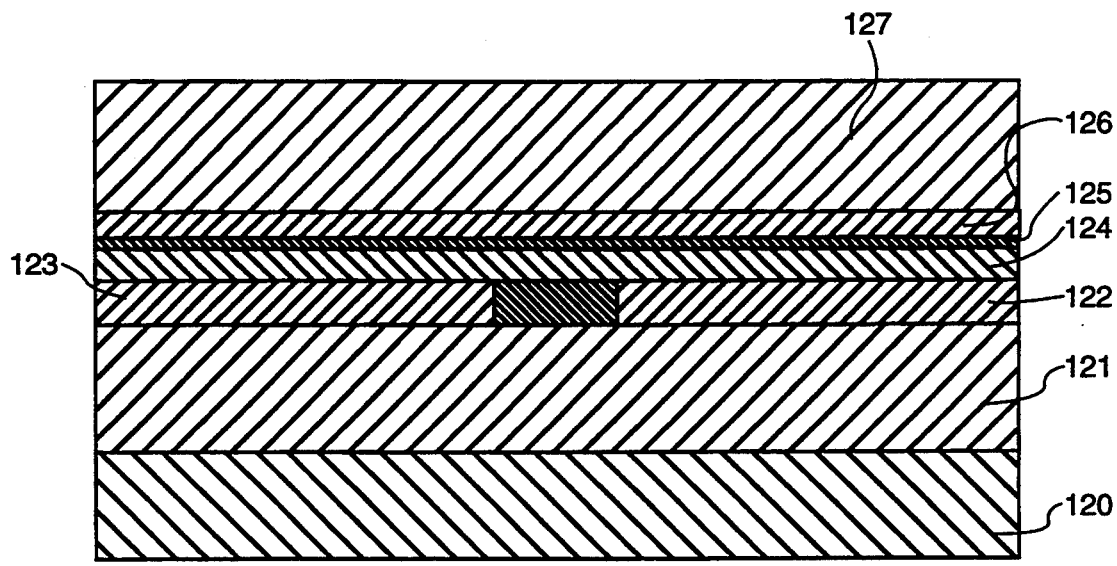
FIG. 27 is a sectional view taken in a direction corresponding to line 2—2 in FIG. 1(b) showing an initial part of the fabrication process for fabricating a semiconductor device of the present invention according to a third embodiment.

First, as shown in FIG. 27, a highly-doped n-type layer 122 is formed on SOI substrates 120 and 121 by antimony diffusion and a highly-doped p-type layer 123 is formed on the substrates by boron diffusion. The npn transistor is formed on the highly-doped n-type layer 122 and the pnp transistor is formed on the highly-doped p-type layer 123. In FIG. 27, 124 identifies an epitaxial layer, 125 and 127 identify silicon oxide films, and 126 identifies a silicon nitride film.

Figure 28:
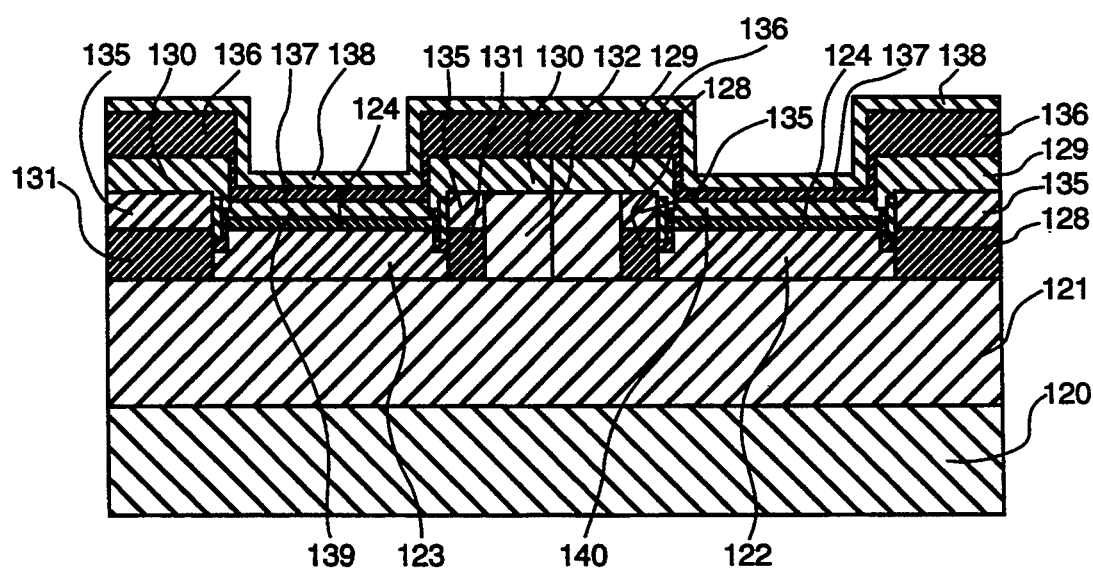
FIG. 28 is sectional view taken in a direction corresponding to line 2—2 in FIG. 1(b) showing the next part of the fabrication process following that of FIG. 27.

A structure shown in FIG. 28 is formed according to the same fabrication steps as those of the first embodiment. However, polycrystal silicon portions 131 and 129 are made p-type by implanting boron, and polycrystal silicon portions 128 and 130 are made n-type by implanting phosphorus. Then, boron is implanted into the npn transistor and phosphorus is implanted into the pnp transistor to form their respective bases 140 and 139, and a silicon nitride film 138 is deposited.

Figure 29:
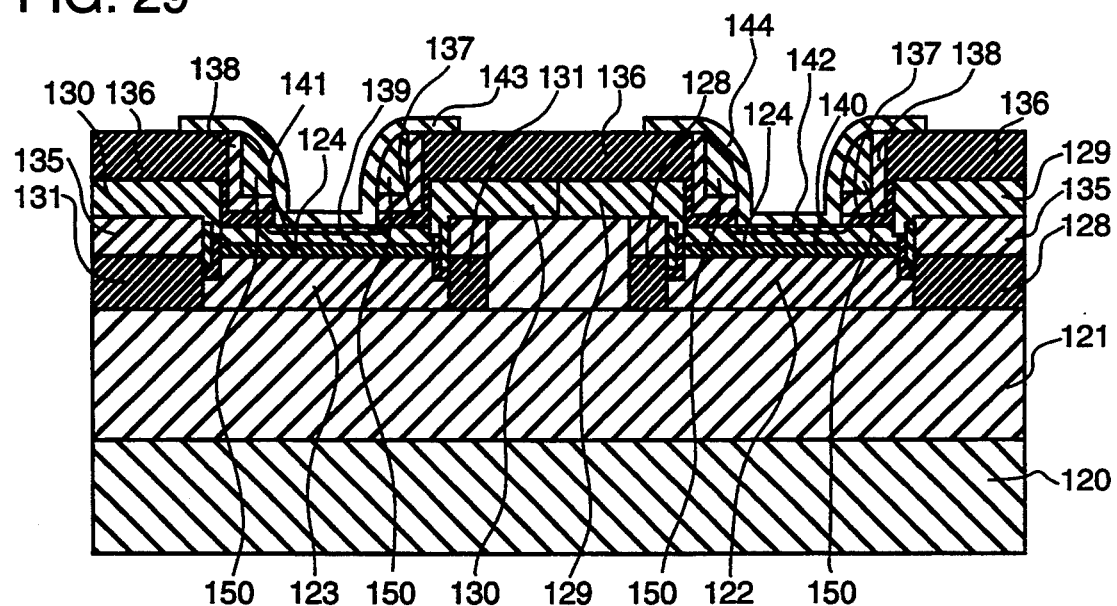
FIG. 29 is sectional view taken in a direction corresponding to line 2—2 in FIG. 1(b) showing the next part of the fabrication process following that of FIG. 28.

As shown in FIG. 29, a silicon oxide film is then deposited and an oxide film 150 is formed on the side wall of the nitride film 138 by anisotropic dry etching. The nitride film 138 is removed by using the oxide films 150 and 136 as masks and moreover, the oxide film 137 is removed to make a contact hole for an emitter. Thereafter polycrystal silicon portions 143 and 144 are deposited and patterned by lithography. Arsenic is implanted into the polycrystal silicon 144 of the npn transistor, and boron is implanted into the polycrystal silicon 143 of the pnp transistor. Their respective emitters 142 and 141 are formed by thermal treatment.

Figure 30:
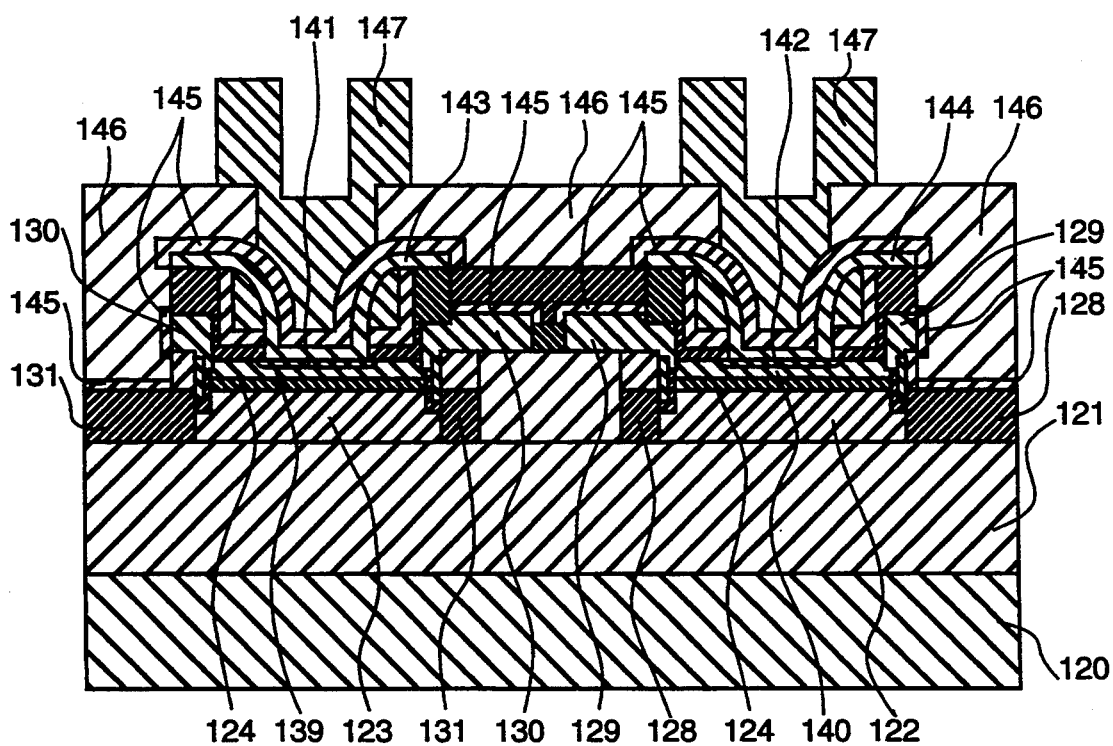

Next, the oxide film 136, polycrystal silicons 129 and 130, and oxide film 135 are removed as shown in FIG. 30. Thereafter, tungsten 145 is deposited on the surfaces of the polycrystal silicon layers 143, 144, 130, 129, 128, and 131. A surface protection oxide film 146 is deposited over the exposed layers and holes are made in the oxide film in preparation of forming emitter metal electrode layers 147. This embodiment makes it possible to realize a high-density, high-speed, and low-power integrated circuit.

A semiconductor device according to a fourth embodiment of the present invention having an npn transistor, pnp transistor, and a complementary MOS transistor formed on the same substrate is described with reference to FIGS. 31 to 35. Since the method for simultaneously forming the npn and pnp transistors is shown in the description of fabricating the device of the third embodiment, only the complementary MOS transistor fabrication method will be described below.

Figure 31:
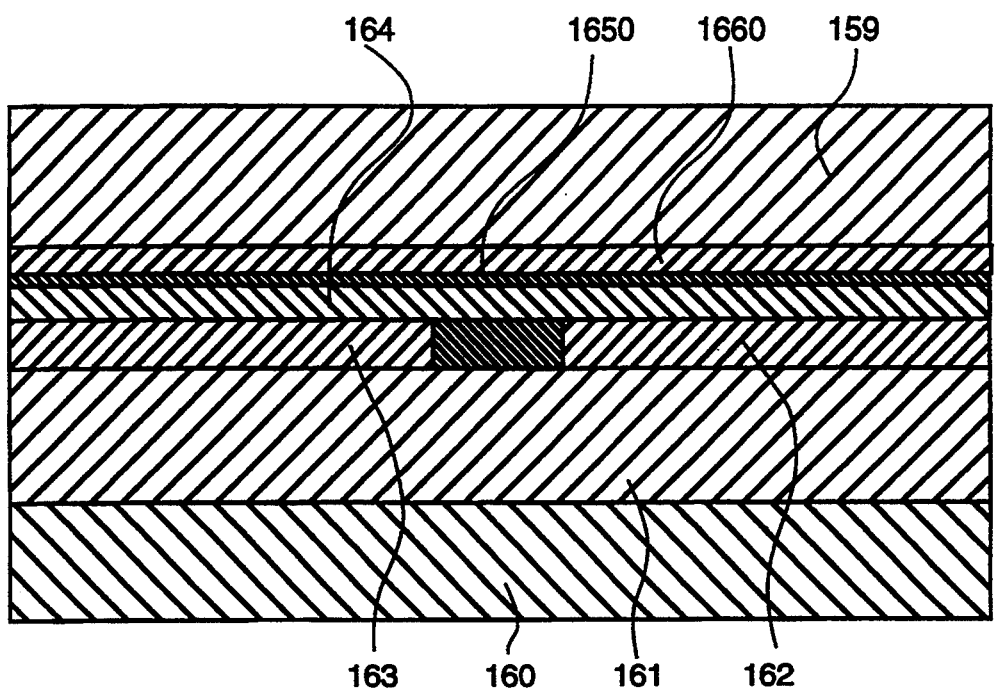
FIG. 31 is a sectional view taken in a direction corresponding to line 2—2 in FIG. 1(b) showing an initial part of the fabrication process for fabricating a semiconductor device of the present invention according to a fourth embodiment.

As shown in FIG. 31, a highly-doped well layer is formed on SOI substrates 161 and 162 and arsenic is implanted into a PMOS forming area 163. The subsequent fabrication process steps are the same as those discussed with reference to the FIGS. 3-14 in the discussion of the fabrication of the device of the first embodiment 1. Accordingly, the highly doped polycrystalline silicon layer 57, which forms the collector electrode in the previous embodiments, forms the well electrodes 165 and 166 in the present embodiment. FIG. 31, 164 identifies an epitaxial layer, 1650 an oxide film, 1660 a silicon nitride film and 159 identifies an oxide film. As stated, the polycrystal silicon layer 59 shown in FIG. 14 has been previously removed.

Figure 32:
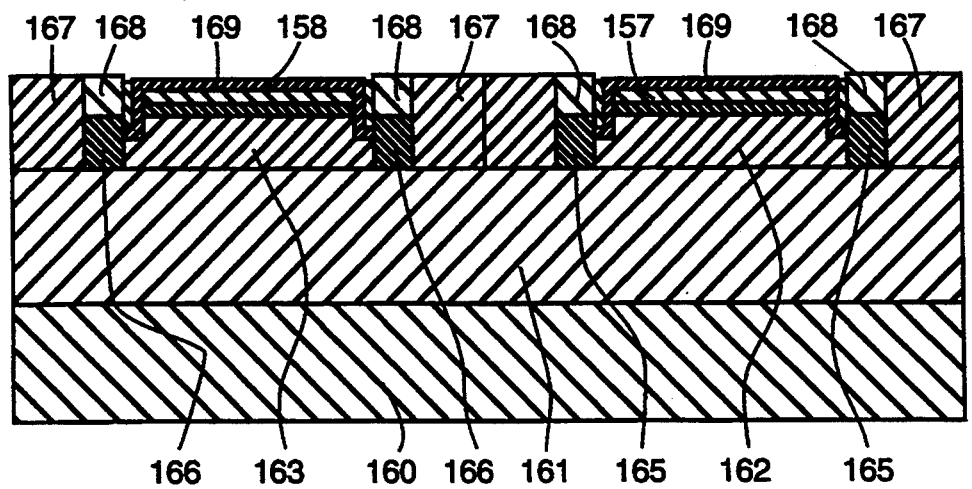
FIG. 32 is sectional view taken in a direction corresponding to line 2—2 in FIG. 1(b) showing the next part of the fabrication process following that of FIG. 31.

Then, as shown in FIG. 32, a low-doped well layer for controlling a threshold voltage is formed by implanting boron into the NMOS and phosphorus into the PMOS regions 157 and 158, respectively. Also shown in FIG. 32, are a silicon substrate 160, oxide 161, oxide films 167, 168, and 169, a highly-doped n-type well 163, and a highly-doped p-type well 162.

Figure 33:
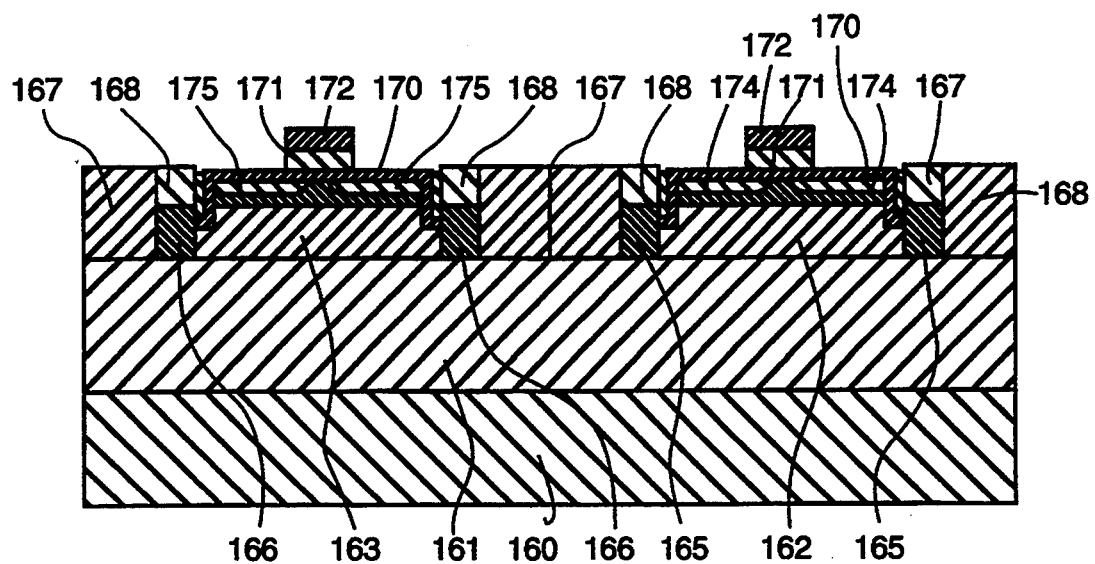
FIG. 33 is sectional view viewed in a direction corresponding to line 2—2 in FIG. 1(b) showing the next part of the fabrication process following that of FIG. 32.
Figure 34:
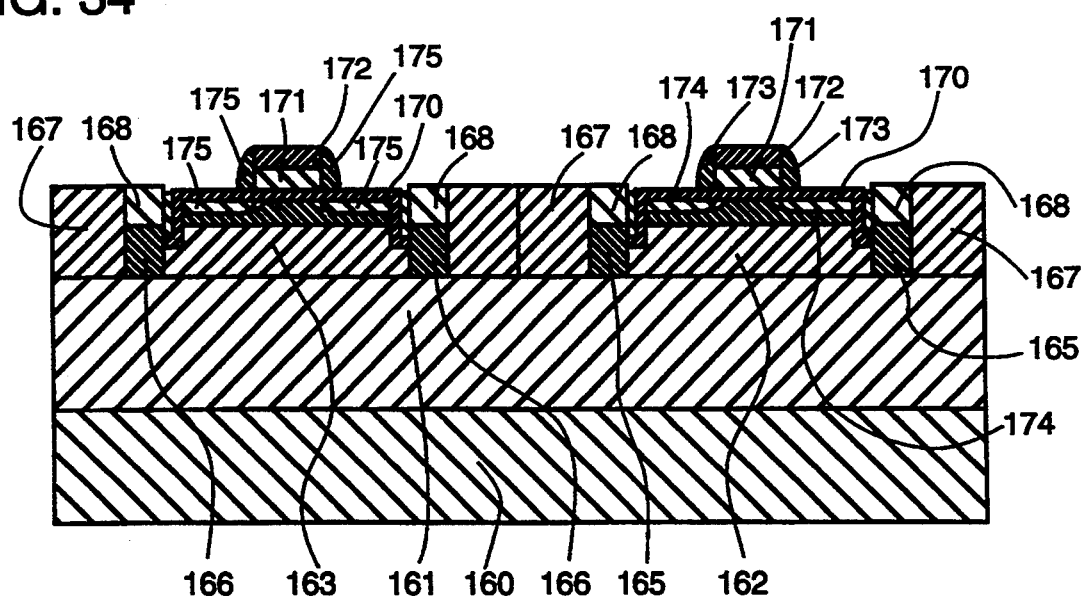
FIG. 34 is sectional view viewed in a direction corresponding to line 2—2 in FIG. 1(b) showing the next part of the fabrication process following that of FIG. 33.

Next, the oxide film 169 on the surface is removed as shown in FIG. 33, and a gate oxide film 170 is formed. Polycrystal silicon layer 171 and oxide film 172 are also deposited. Then, the polycrystal silicon layer 171 and oxide film 172 are patterned by lithography to form a gate electrode. Subsequently, a low-doped source and a low-doped drain (174 and 175 respectively) are formed by implanting arsenic or phosphorus into the NMOS and boron into the PMOS.

In the following fabrication step, an oxide film 173 is deposited on the entire surface, and oxide film 173 is etched to leave a side wall of a gate electrode 171 by anisotropic dry etching. Highly-doped sources and drains 174 and 175, respectively, are formed by implanting arsenic or phosphorus into the NMOS region and boron into the PMOS region.

Figure 35:
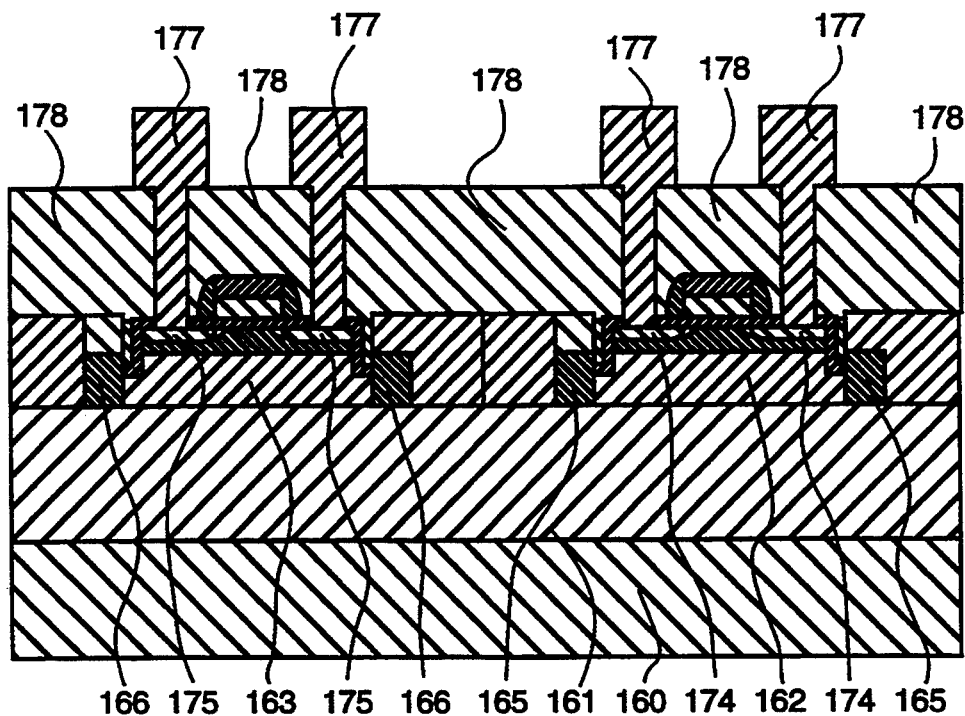
FIG. 35 is a sectional view of the element structure of a semiconductor device of a fourth embodiment according to the present invention.

Then, as shown in FIG. 35, an oxide film 178 for surface protection is deposited and contact holes are made in the oxide film 178, in preparation of the forming of the metallic electrodes 177 for the sources and drains. Thus, a high-density, high-speed, and low-power memory integrated circuit can be formed by combining a memory cell of the CMOS structure of the fourth embodiment with a peripheral circuit of the npn and pnp transistors of the third embodiment.

As in the semiconductor device of the above embodiments, the transistor area can be decreased to approximately 1/10 of that of comparable conventional transistors and a high-density high-speed LSI chip including a bipolar transistor can be produced. Moreover, the pnp and CMOS transistors can be formed on the same substrate.

The present invention makes it possible to provide a transistor having a small occupation area and high performance.

We claim:

1. A semiconductor device formed in a convex area of a single crystal semiconductor on an insulator, comprising:
a collector semiconductor area, a base single crystal semiconductor area, and an emitter single crystal semiconductor area;
a bottom surface of the collector area being formed in contact with the insulator;
a top surface of the collector area being connected to the bottom surface of the base area;
the emitter area being formed in the base area;
a collector electrode being formed on the insulator and connected to peripheral side portions of the collector area;
a first insulator of isolation being formed on one peripheral side of the collector electrode and a collector contact being formed on the other peripheral side thereof;
a base electrode being formed on the first insulator of isolation and connected to the base area;
a second insulator of isolation being formed on a peripheral side of the base electrode; and
an emitter electrode being formed on the second insulator of isolation and being connected to the emitter area.

2. A semiconductor device according to claim 1, wherein a passivation insulator film is so formed that it covers the convex single crystal semiconductor area, the collector electrode, the base electrode, and the emitter electrode, and
an emitter electrode layer is connected to the emitter electrode through an opening formed in the passivation insulator film.

3. A semiconductor device according to claim 1, wherein the insulator is an oxide film formed on a semiconductor substrate.

4. A semiconductor device according to claim 1, wherein the emitter electrode is so formed that it covers almost an entire top surface of the convex single crystal semiconductor area.

5. A semiconductor device according to claim 1, wherein the collector electrode, the base electrode, and the emitter electrode are formed in a first polycrystal semiconductor area, second polycrystal semiconductor area, and third polycrystal semiconductor area respectively.

6. A semiconductor device according to claim 5, wherein a refractory metal or refractory metal silicide is formed on the surfaces of the first polycrystal semiconductor area, the second polycrystal semiconductor area, and the third polycrystal semiconductor area, respectively.

7. A semiconductor device according to claim 1, wherein the collector semiconductor area comprises a highly-doped collector area formed on the insulator and a low-doped collector area arranged between the highly-doped collector area and the base single crystal semiconductor area.

8. A semiconductor device according to claim 1, wherein said collector area is a single crystal semiconductor area.

9. A semiconductor device formed in a convex area of a semiconductor, comprising:
a first insulator formed on a substrate;

a collector semiconductor area formed with a bottom surface in contact with the first insulator and having a periphery;

a base single crystal semiconductor area formed to have a bottom surface in contact with a top surface of the collector area;

an emitter single crystal semiconductor area formed in the base;

a collector electrode formed on the first insulator and connected with the collector area about its periphery;

a second insulator formed on the collector electrode for isolating the collector electrode;

said collector electrode having a portion passing laterally through said second insulator and having a side contact;

a base electrode formed on the second insulator and connected to the base single crystal semiconductor area;

an emitter electrode connected to the emitter single crystal semiconductor area; and a third insulator area formed between said base and emitter electrodes.

10. A semiconductor device according to claim 9, further comprising a fourth insulator formed on the base electrode; and said base electrode having a side contact portion passing through the fourth insulator for permitting side connection of the base electrode to another device.

11. A semiconductor device according to claim 10, further comprising a fifth insulator formed on bare surfaces of the base and collector electrodes.

12. A semiconductor device according to claim 9, wherein said collector area is a single crystal semiconductor area and has a junction area with the collector electrode at a side edge of the periphery of the collector.

13. A semiconductor device according to claim 9, wherein said collector electrode has a width of 200 to 300 nm formed in a thickness direction of the collector electrode layer.

14. A semiconductor device according to claim 9, wherein a refractory metal silicide is deposited on at least the base electrode.

15. A semiconductor device according to claim 9, wherein a refractory metal silicide is deposited on all of the electrodes.

16. A semiconductor device according to claim 9, wherein a peripheral edge defining a width of said base electrode is coincident with the corresponding edge of the emitter electrode, both said edges being etched by the same mask.

17. A semiconductor device according to claim 9, wherein side edges of the periphery of the base and emitter electrodes are aligned and a portion of said base electrode extends away from said periphery of the base and emitter electrodes for connection to another device or device component.

18. A semiconductor device according to claim 9, wherein said device is a bipolar transistor and a plurality of said transistors are included in an LSI.

19. A semiconductor device according to claim 9, wherein said device is a bipolar transistor and a plurality of said transistors are formed along with MOS transistors in an LSI.

20. A semiconductor device having complementary bipolar transistors, wherein each of said transistors comprises:

a first insulator formed on a substrate;

a collector semiconductor area formed with a bottom surface in contact with the first insulator and having a periphery;

a base single crystal semiconductor area formed to have a bottom surface in contact with a top surface of the collector area;

an emitter single crystal semiconductor area formed in the base;

a collector electrode formed on the first insulator and connected with the collector area about its periphery;

a second insulator formed on the collector electrode for isolating the collector electrode;

said collector electrode having a portion passing laterally through said second insulator and having a side contact;

a base electrode formed on the second insulator and connected to the base single crystal semiconductor area;

an emitter electrode connected to the emitter single crystal semiconductor area; and a third insulator area formed between said base and emitter electrodes.

21. A semiconductor device formed in a convex area of a single crystal semiconductor on an insulator, comprising:

a plurality of collector semiconductor areas doped to become collectors for bipolar transistors;

a base single crystal semiconductor area, and an emitter single crystal semiconductor area for each of said bipolar transistors;

a bottom surface of the collector areas being formed in contact with the insulator;

a top surface of the collector areas being connected to the bottom surface of the base area and the emitter area being formed in the base area for each of said transistors;

a collector electrode being formed on the insulator and connected to peripheral side portions of the collector area for each of said transistors and an insulating film being formed on the insulator in corresponding peripheral side portions of the collector area for each of said transistors, wherein each said bipolar transistor further includes:

a first insulator of isolation being formed on one peripheral side of the collector electrode and a collector contact being formed on the other peripheral side thereof;

a base electrode being formed on the first insulator of isolation and connected to the base area;

a second insulator of isolation being formed on a peripheral side of the base electrode; and an emitter electrode being formed on the second insulator of isolation and being connected to the emitter area.

22. A semiconductor device according to claim 21, wherein said device further includes a plurality of MOS transistors formed on a common substrate in an LSI.

23. A semiconductor device formed in a convex area of a single crystal semiconductor on an insulator, comprising:

a semiconductor well area having a bottom portion in contact with the insulator and a top portion in which source and drain areas are formed;

first insulators of isolation formed on peripheral sides of the source and drain areas;

a well electrode formed on the insulator and connected to peripheral side portions of the well area;

a second insulator of isolation covering the source and drain areas;

a gate electrode being formed on the second insulator of isolation between said source and drain areas; and source and drain electrodes being formed to extend through the second insulator of isolation to connect respectively to the source and drain, wherein a passivation insulator film is formed to cover the first and second insulators of isolation and the gate electrode, and said source and drain electrodes are connected to the source and drain, respectively, through an opening formed in the passivation insulator film.

24. A semiconductor device formed in a convex area of a single crystal semiconductor on an insulator, comprising:

a semiconductor layer formed on said insulator and having areas doped to become one of collectors for bipolar transistors and wells of MOS transistors;

a gate single crystal semiconductor area, and an emitter single crystal semiconductor area for each of said bipolar transistors;

a bottom surface of the collector areas being formed in contact with the insulator;

a top surface of the collector areas being connected to the bottom surface of the base area and the emitter area being formed in the base area for each of said transistors;

a collector electrode being formed on the insulator and connected to peripheral side portions of the collector area for each of said transistors and an insulating film being formed on the insulator in corresponding peripheral side portions of the collector areas for each of said MOS transistors, wherein each said bipolar transistor further includes:

a first insulator of isolation being formed on one peripheral side of the collector electrode and a collector contact being formed on the other peripheral side thereof;

a base electrode being formed on the first insulator of isolation and connected to the base area;

a second insulator of isolation being formed on a peripheral side of the base electrode; and an emitter electrode being formed on the second insulator of isolation and being connected to the emitter area;

and wherein each said MOS transistor further includes:

a semiconductor well area having a bottom portion in contact with the insulator and a top portion in which source and drain areas are formed;

first insulators of isolation formed on peripheral sides of the source and drain areas;

a well electrode formed on the insulator and connected to peripheral side portions of the well area;

a second insulator of isolation covering the source and drain areas;

a gate electrode being formed on the second insulator of isolation between said source and drain areas; and source and drain electrodes being formed to extend through the second insulator of isolation to connect respectively to the source and drain.

* * * * *